(12) United States Patent
Prakash et al.

(10) Patent No.: US 8,972,915 B2
(45) Date of Patent: Mar. 3, 2015

(54) STATIC TIMING ANALYSIS OF TEMPLATE-BASED ASYNCHRONOUS CIRCUITS

(75) Inventors: Mallika Prakash, Santa Clara, CA (US); Peter A. Beerel, Encino, CA (US)

(73) Assignee: University of Southern California, Los Angeles, CA (US)

( * ) Notice: Subject to any disclaimer, the term of this patent is extended or adjusted under 35 U.S.C. 154(b) by 818 days.

(21) Appl. No.: 12/370,496

(22) Filed: Feb. 12, 2009

(65) Prior Publication Data

US 2009/0210841 A1 Aug. 20, 2009

Related U.S. Application Data

(60) Provisional application No. 61/028,066, filed on Feb. 12, 2008.

(51) Int. Cl.
*G06F 17/50* (2006.01)
(52) U.S. Cl.
CPC ................................ *G06F 17/5031* (2013.01)
USPC ........... 716/108; 716/106; 716/111; 716/113; 716/124; 716/134
(58) Field of Classification Search
CPC .................................................. G06F 17/5031
See application file for complete search history.

(56) References Cited

U.S. PATENT DOCUMENTS

| | | | |
|---|---|---|---|
| 5,650,938 A * | 7/1997 | Bootehsaz et al. | 716/102 |
| 6,594,806 B1 * | 7/2003 | Casavant | 716/102 |
| 6,785,875 B2 * | 8/2004 | Beerel et al. | 716/113 |
| 6,854,096 B2 * | 2/2005 | Eaton et al. | 716/122 |
| 6,961,861 B2 * | 11/2005 | Koltzoff et al. | 713/400 |
| 7,319,729 B2 * | 1/2008 | Gundurao et al. | 375/354 |
| 7,519,939 B2 * | 4/2009 | Tsuchiya | 716/132 |
| 7,787,577 B2 * | 8/2010 | Gundurao et al. | 375/354 |
| 2005/0216247 A1 * | 9/2005 | Ikeda et al. | 703/19 |

(Continued)

OTHER PUBLICATIONS

Bradley R. Quinton et al., Asynchronous IC Interconnect Network Design and Implementation Using a Standard Asic Flow, Proceedings of the 2005 IEEE International Conference on Computer Design, pp. 267-274, Oct. 2005.*

(Continued)

*Primary Examiner* — A. M. Thompson
(74) *Attorney, Agent, or Firm* — McDermott Will & Emery LLP

(57) ABSTRACT

Effective timing and power characterization flows are described for asynchronous circuits. Verification can be provided for both relative-timing constraints as well as performance (e.g., throughput) targets using commercially-standard STA tools. Fully-automated scripts are developed that verify all relative timing assumptions (e.g., isochronic forks) as well as the gate-level performance of any circuit designed with these templates. Library characterization can be utilized and asynchronous logic cells not found in standard-cell libraries, such as dual-rail domino logic and dynamic C-elements with staticizers, can be characterized in terms of both their timing and power. These values are a function of both input slew and output load and are preferably captured in an industry standard format, such as the Liberty™ file format, before being compatible with commercial STA tools. Using a characterized library, timing correctness and performance of an asynchronous circuit can be analyzed either through back-annotated simulations or preferably static analysis.

31 Claims, 20 Drawing Sheets

(56) References Cited

U.S. PATENT DOCUMENTS

| | | | |
|---|---|---|---|
| 2007/0244676 A1* | 10/2007 | Shang et al. .................. | 703/2 |
| 2008/0112520 A1* | 5/2008 | Gundurao et al. ............ | 375/354 |
| 2009/0106719 A1* | 4/2009 | Stevens ......................... | 716/6 |
| 2009/0210841 A1* | 8/2009 | Prakash et al. ................ | 716/6 |

OTHER PUBLICATIONS

Rahul Rithe, Accurate Timing and Power Characterization of Static Single-Track Full-Buffers, Department of Electronics and Electrical Communication, Indian Institue of Technology Kharagpur, India, pp. 1-13, Jul. 2007.*

Sanjit A. Seshia et al., Modeling and Verifying Circuits Using Generalized Relative Timing, Proceedings of the 11th IEEE International Symposium on Asynchronous Circuits and Systems, pp. 1-11, Jan. 2005.*

Ken Stevens et al., CAD Directions for High Performance Asynchronous Circuits, Proceedings of the Digital Automation Conference, pp. 116-121, Jun. 1999.*

Kenneth S. Stevens et al., Characterization of Asynchronous Templates for Integration into Clocked CAD Flows, 15th IEEE Symposium on Asynchronous Circuits and Systems, pp. 151-161, May 2009.*

Pankaj Golani et al., Back Annotation in High Speed Asynchronous Design, Journal of Low Power Electronics 2, pp. 37-44, May 2006.*

Uri Cummings, Asynchronous Logic in PivotPoint: A Commercial Switch SoC, Fulcrum MicroSystems, pp. 1-35. 2004.*

Golani, P. et al. 2006. Back-Annotation in High-Speed Asynchronous Design. Journal of Low Power Electronics, vol. 2: pp. 37-44.

* cited by examiner

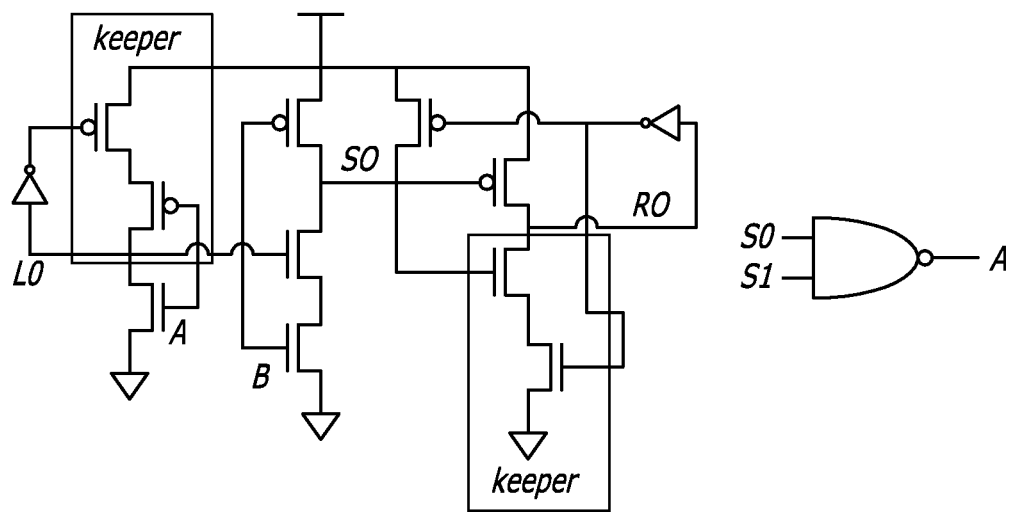
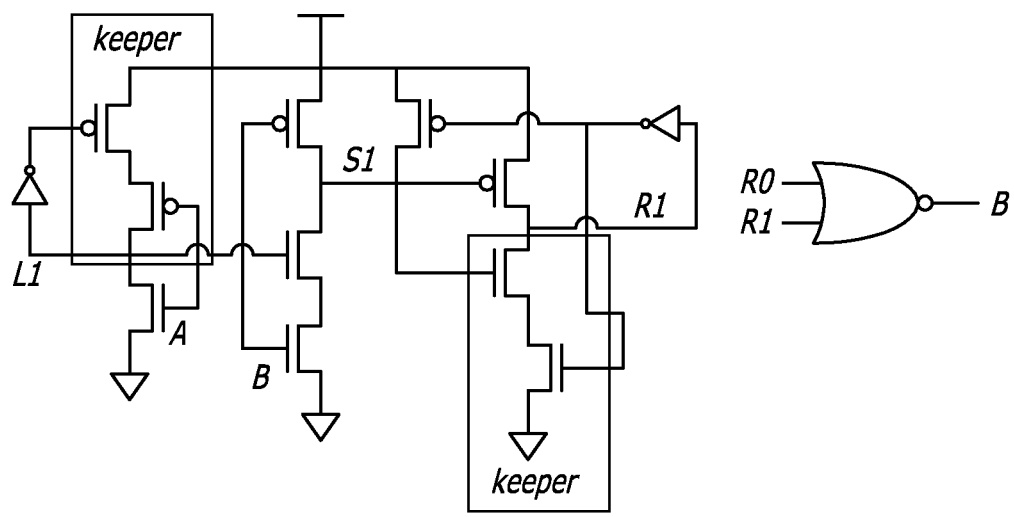
FIG. 2

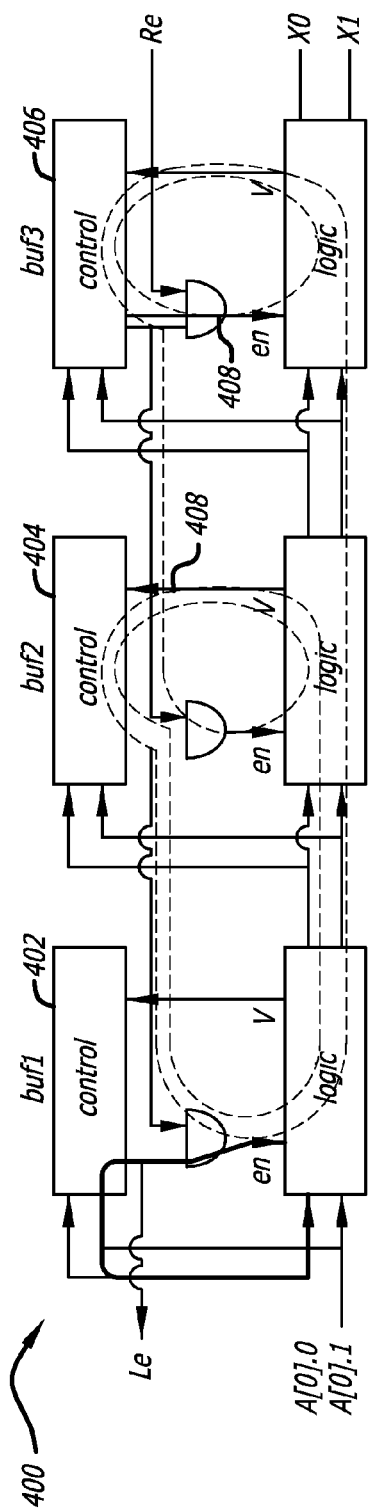
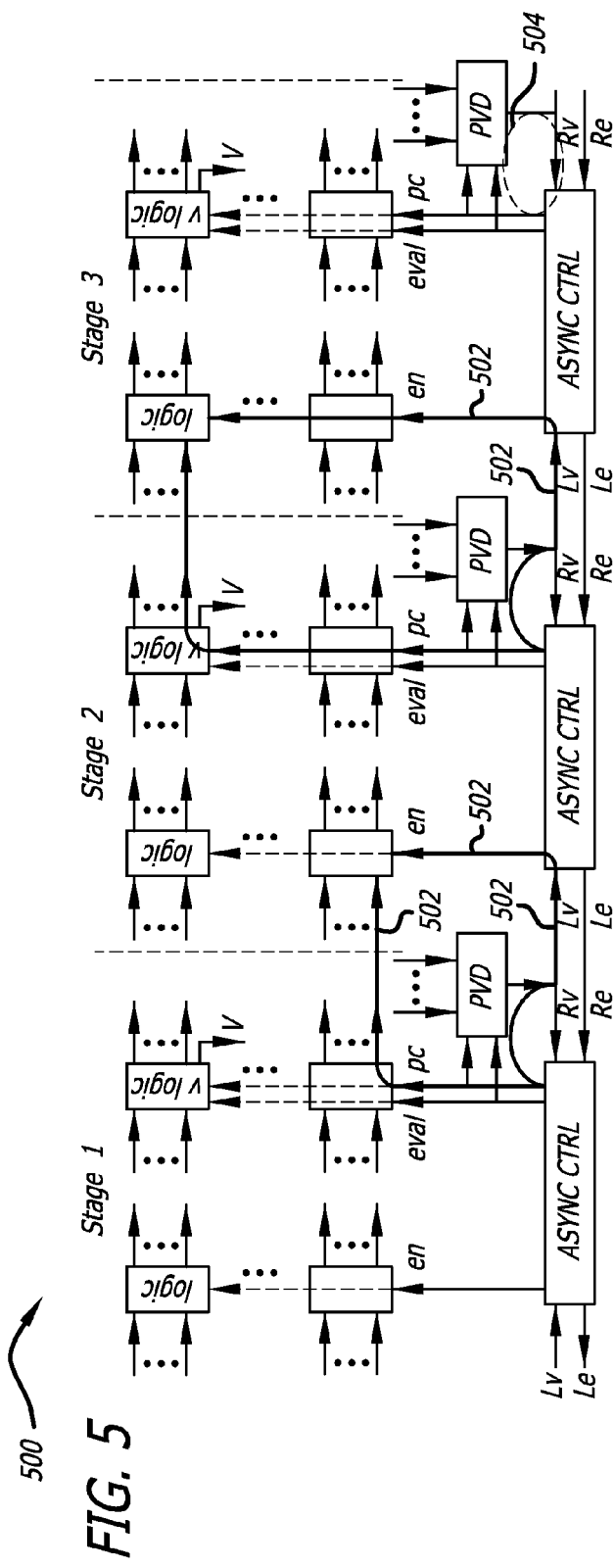
FIG. 4
FIG. 5

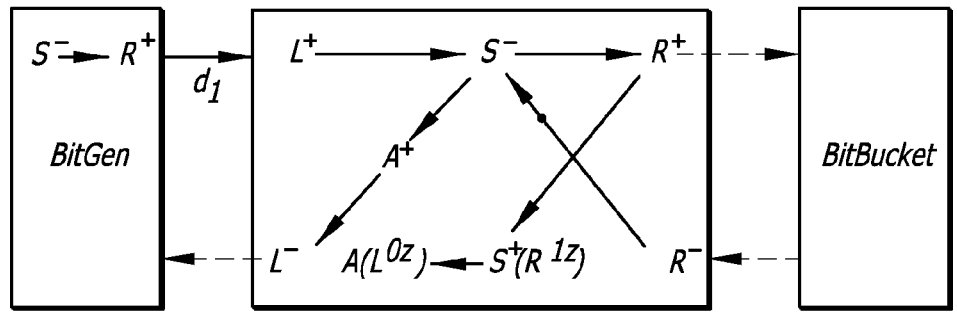
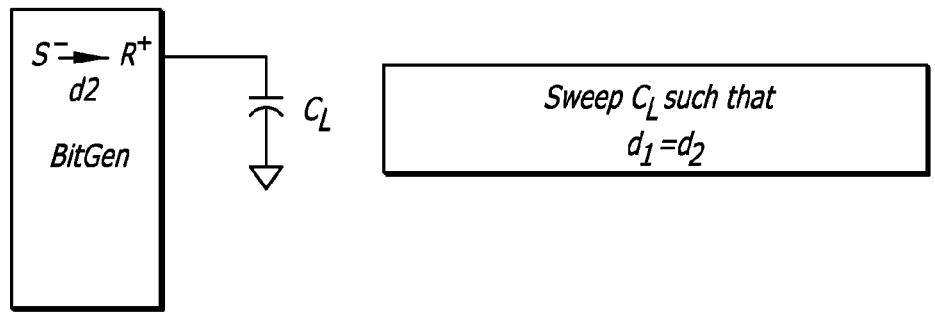
FIG. 9A
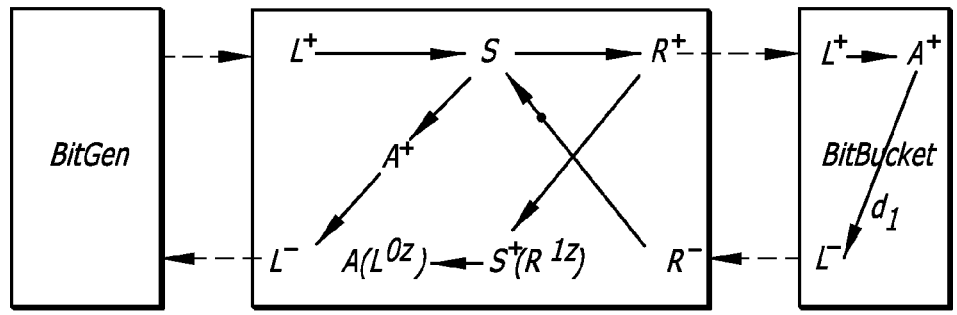
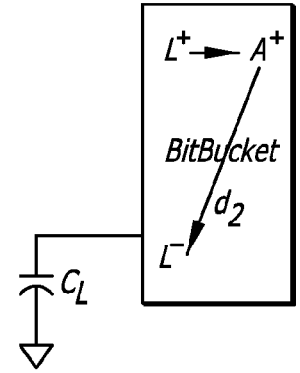
FIG. 9B set_min_delay 1 -fall_from buf1/buf_v_logic/pc
-fall_from buf1/buf_v_logic/V set_min_delay 1 -fall_from buf1/buf_v_logic/V
-rise_to buf1/buf_v_logic/_pc

FIG. 19

```
for {set rail 0} {$rail < 2} {incr rail} {
set list_contrainec_pins [list:
foreach_in_collection [ get_cells-hierearchica"*"] {
    if {[regexp {LOGIC([1-6])}$lib_name match num_inputs } then {
        for {set x 0} {$x<$num_inputs} {incr x} {
            set coll_drivers [get_drivers $cell_name/A [$x] $rail:
            if{[ sizeof_collection $coll_drivers]==0} {
                set clock_pir [get_object [index_collection]all_fanin-to $cell_name/
                set related_pin....
            } else {
                set fanin [get_cells-of [get_drivers $cll_name/A[$x] $rail]
                set fanin_lib [get_attribute[ get_cells [get_object $fanin]] ref_name:
                if { [regexp X $rail [get_object_name $coll_drivers]]} {
                    set_disable_timing -from en-to X [expr $rai] [get_object $rai] [get_object $fanin:
                    remove_disable_timing -from en -to X $rail [get_object $ fanin:
                    set clock_pin....
                } else {
                    set_disable_timing -from en -to X [expr $rai ] [get_object $fanin:
                    remove_disable_timing -from en -to X $rai]get_object $fanin:
                    set clock_pin...}} set_data_check -clock$clock_pin -rise from $relatec_pir|
    fall_to$constrainec_pir-setup 0.5

[append list_constrainec_pins $constrainec_pir }}} foreach constrained_pir $list_constrainec_pins {
    report_timing -to $constrainec_pin>>$loc_}}
}
```

1900

```
Startpoint: buf1/buf_logic/en
            (clock source 'buf1/buf_logic/en')
Endpoint: buf2/buf_logic
            (rising edge-triggered data to data check clocked by
            buf1/buf_logic/en
Pathc Group: buf1/buf_logic/en
Path Type: max Point                                                    Incr       Path
------------------------------------------------------------------------
clock buf1/buf_logic/en (fall edge)                      0.00       0.00
clock source latency                                     0.00       0.00
buf1/buf_logic/en (synthesis.qdi.logic1.LOGIC1_1.1)
                                                         0.00       0.00 f
buf1/buf_logic/X.0 (synthesis.qdi.logic1.LOGIC1_1.1)
                                                         0.37       0.37 f
buf1/X.0 (buf)                                           0.00       0.37 f
buf2/A[0].0 (buf)                                        0.00       0.37 f
buf2/buf_logic/A[0].0 (synthesis.qdi.logic1.LOGIC1_1.1)
                                                         0.00       0.37 f
data arrival time                                                   0.37 clock buf1/buf_logic/en (fall edge)                      0.00       0.00
clock source latency                                     0.00       0.00
buf2/buf_logic/en (synthesis.qdi.logic1.LOGIC1_1:1)
                                                         0.00       0.00 f
buf2/buf_logic/X.0 (synthesis.qdi.logic1.LOGIC1_1:1)
                                                         0.37       0.37 r
buf2/buf_ctrl/en (synthesis.qdi.special.CTRL11.1)
                                                         0.56       0.93 r
buf2/buf_ctree/x (synthesis.qdi.special/CTREE2.1)
                                                         0.14       1.07 r
buf2/buf_logic/en (synthesis.qdi.logic1.LOGIC1_1.1)
                                                         0.00       1.07 r
data check setup time                                   -0.50       0.57
data required time                                                  0.57
------------------------------------------------------------------------
data required time                                                  0.57
data arrival time                                                  -0.37
------------------------------------------------------------------------
stack (MET)                                                         0.20
```

FIG. 20A

```
Startpoint: buf1/controller/_pc
           (clock source 'buf1/controller/_pc')
Endpoint: buf2/buf_v_logic
          (rising edge-triggered data to data check clocked by
          buf1/controller/_pc
Pathc Group: buf1/controller/_pc
Path Type: max Point                                              Incr      Path
--------------------------------------------------------------- clock buf1/controller/_pc (fall edge)              0.00      0.00
clock source latency                               0.00      0.00
buf1/controller/_pc (synthesis.mld.special.CTRL.1)
                                                   0.00      0.00 f
buf1/buf_v_logic/X.0 (synthesis.mld.logic1.V_LOGIC1_1.1)
                                                   0.26      0.26 f
buf1/R[0] (mld_buf1)                               0.00      0.26 f
buf2/L[0] (mld_buf_l1)                             0.00      0.26 f
buf1/buf_v_logic/A[0].0 (synthesis.mld.logic1.V_LOGIC1_1.1)
                                                   0.00      0.26 f
data arrival time                                            0.26 clock buf1/controller/_pc (fall edge)              0.00      0.00
clock source latency                               0.00      0.00
buf2/controller/_pc (synthesis.mld.special.CTRL.1)
                                                   0.00      0.00 f
buf2/controller/_pc (synthesis.mld.logic1.V_LOGIC1_1.1)
                                                   0.40      0.40 f
buf2/controller/L.e (synthesis.mld.special.CTRL.1)
                                                   0.27      0.68 r
buf2/controller/en (synthesis.mld.special.CTRL.1)
                                                   0.23      0.90 r
buf2/controller/eval (synthesis.mld.special.CTRL.1)
                                                   0.27      1.17 r
buf2/buf_v_logic/eval (synthesis.mld.logic1.V_LOGIC1_1.1_)
                                                   0.00      1.17 r
data check setup time                             -0.50      0.67
data required time                                           0.67
---------------------------------------------------------------
data required time                                           0.67
data arrival time                                           -0.26
---------------------------------------------------------------
stack (MET)                                                  0.42
```

FIG. 20B

```
Startpoint: buf1/buf1_logic/en
            (internal path start/point)
Endpoint: buf3/buf1_logic/en
            (internal path endpoint)
Pathc Group: default
Path Type: max Point                                                      Incr      Path
---------------------------------------------------------------------------- input external delay                                       0.00      0.00 r
buf1/buf1_logic/en (synthesis.qdi.logic1.LOGIC1_1.1)
                                                           0.00      0.00 r
buf1/buf1_logic/X.0 (synthesis.qdi.logic1.LOGIC1_1.1)
                                                           0.39      0.39 r
buf1/X.0 (buf)                                             0.00      0.39 r
buf2/A[0[.0 (buf)                                          0.00      0.39 r
buf2/buf1_logic/X.1 (synthesis.qdi.logic1.LOGIC1_1.1)
                                                           0.37      0.76 r
buf1/X.0 (buf)                                             0.00      0.76 r
buf3/A[0[.1 (buf)                                          0.00      0.76 r
buf3/buf1_logic/V (synthesis.qdi.logic1.LOGIC1_1.1)
                                                           0.32      1.09 r
buf3/buf1_ctrl/en (synthesis.qdi.special.CTRL11.1)
                                                           0.31      1.40 f
buf3/buf1_ctree/x (synthesis.qdi.special/CTREE2.1)
                                                           0.22      0.61 f
buf3/buf1_logic/en (synthesis.qdi.logic1.LOGIC1_1.1)
                                                           0.00      1.61 f
data arrival time                                                    1.61 data check setup time                                      2.00      2.00
output external delay                                      0.00      2.00
data required time                                                   2.00
----------------------------------------------------------------------------
data required time                                                   2.00
data arrival time                                                   -1.61
----------------------------------------------------------------------------
stack (MET)                                                          0.39
```

FIG. 21A

2100B

```
Startpoint: buf2/buf_v_logic/X.0
        (internal path startpoint)
Endpoint: buf3/buf_v_logic/X.1
        (internal path endpoint)
Pathc Group: default
Path Type: max Point                                              Incr        Path
------------------------------------------------------------------ input external delay                               0.00        0.00 r
buf1/buf_v_logic/X.0 (synthesis.mls.logic1.V_LOGIC1_1.1)
                                                   0.00        0.00 r
buf2/R[0] (mld_buf_l1)                             0.00        0.00 r
buf3/L[0] (mld_buf_l1)                             0.00        0.00 r
buf3/buf_v_logic/X.1 (synthesis.mld.logic1.V_LOGIC1_1.1)
                                                   0.07        0.07 r
data arrival time                                              0.07 max_delay                                          2.00        2.00
output external delay                              0.00        2.00
data required time                                             2.00
------------------------------------------------------------------
data required time                                             2.00
data arrival time                                             -0.07
------------------------------------------------------------------
stack (MET)                                                    1.93
```

FIG. 21B

Computer System

US 8,972,915 B2

STATIC TIMING ANALYSIS OF TEMPLATE-BASED ASYNCHRONOUS CIRCUITS

RELATED APPLICATION

This application claims the benefit of U.S. Provisional Patent Application No. 61/028,066, entitled "Static Timing Analysis of Template-Based Asynchronous Circuits," filed 12 Feb. 2008, the entire contents of which are incorporated herein by reference.

BACKGROUND

There is a growing need for high performance low power circuits in areas such as on-chip interconnect and globally asynchronous locally synchronous ("GALS") systems. Many template-based asynchronous circuits fulfill these needs but are not easily accepted by designers due to a lack of support by commercial CAD tools, including in particular, timing sign-off.

Previous approached using relative timing ("RT") have been introduced for modeling and verifying circuits that have timing constraints that must be satisfied to guarantee correct operation. Relative timing is premised on the observation that timing correctness typically depends on enforcing a relative ordering between signals that can and should be explicitly identified and verified. Coupled with absolute margins, such RT constraints should be adhered to during synthesis and P&R and then verified post-layout. Previous work in RT has presented various approaches for using the relative timing approach during synthesis and verification of asynchronous systems. However, the connection between relative timing and post-layout sign-off using static timing analysis has yet to be addressed.

Some previous techniques have applied static timing analysis ("STA") tools in desynchronization. One such technique includes a fully-automated flow from synthesis to place and route in which an asynchronous design is produced from a synchronous Verilog netlist by replacing each flip-flop with two latches and the clock with handshaking control signals coupled with run-time-configurable matched delay lines. As part of such flow, STA is used to verify correct timing in the specific semi-decoupled four-phase controllers used, but such a technique fails to provide an extension to template-based circuit design. In addition, the verification is not based on relative timing but rather on max-delay constraints with absolute metrics, which can lead to false negatives. Virtual clocks are added to the design to model the datapath as a conventional master-slave latch-based design with non-overlapping clocks. This guarantees that the latency of the combinational logic is constrained and that the associated delay-lines will be sufficiently long.

What is needed therefore are new techniques that provide for improved and effective timing and power characterization flows for asynchronous circuits.

SUMMARY

The present disclosure is directed to novel techniques/methods/systems addressing and remedying the limitations noted previously.

Aspects and embodiments of the present disclosure provide for effective timing and power characterization flows for asynchronous circuits. Embodiments of the present disclosure can provide for verification of both relative-timing constraints as well as performance (e.g., throughput) targets using commercially-available STA tools. Fully-automated scripts can be developed that verify all relative timing assumptions (e.g., isochronic forks) as well as the gate-level performance of any circuit designed with these templates.

Exemplary embodiments are directed to different asynchronous design methodologies, including static single track full buffer ("SSTFB") template, pre-charged-half-buffer ("PCHB") templates, and/or a multi-level domino ("MLD") templates in which stages consist of multi-level domino-dual-rail logic and a full-buffer handshake controller.

One skilled in the art will appreciate that embodiments of the present disclosure can be implemented in computer-readable medium (e.g., hardware, software, firmware, or any combinations of such), and can be distributed over one or more networks. Steps described herein, including processing functions to derive, learn, or calculate formula and/or mathematical models utilized and/or produced by the embodiments of the present disclosure, can be processed by one or more suitable processors, e.g., central processing units ("CPUs) implementing suitable code/instructions in any suitable language (machine dependent on machine independent).

While aspects of the present disclosure are described herein in connection with certain embodiments, it is noted that variations can be made by one with skill in the applicable arts within the spirit of the present disclosure and the scope of the appended claims.

BRIEF DESCRIPTION OF DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 2 depicts a more detailed schematic of a static single track full buffer dual-rail buffer, in accordance with exemplary embodiments of the present disclosure;

FIG. 4 depicts a diagram of a three-stage PCHB pipeline highlighting the relative timing constraint and timing loops, in accordance with an embodiment of the present disclosure;

FIG. 5 depicts a block diagram of a multi-level domino pipeline highlighting the relative timing constrain (thick solid lines) and the minimum pulse width constraints (dotted lines), in accordance with an embodiment of the present disclosure;

FIG. 7A depicts synchronous circuits, and FIG. 7B depicts asynchronous circuits;

FIG. 9A depicts a configuration for measuring pin capacitance of a pin (A0) of a buffer, in accordance with an exemplary embodiment of the present disclosure; FIG. 9B depicts a configuration for measuring pin capacitance of a pin (R0) of a buffer, in accordance with an exemplary embodiment of the present disclosure;

FIG. 10A shows an incorrect HSpice® simulator set-up, and FIG. 10B shows a correct HSpice® simulator set-up;

FIG. 18A depicts PCHB, and FIG. 18B depicts MLD templates;

FIG. 19 depicts a relative timing constraints verification script for PCHB, in accordance with exemplary embodiments of the present disclosure;

FIGS. 20A-B depict an exemplary relative timing constraints verification report. FIG. 20A depicts PCHB, and FIG. 20B depicts MLD templates; and FIGS. 21A-B depict an exemplary performance verification report. FIG. 21A depicts PCHB and FIG. 21B depicts MLD templates.

Figure 1:
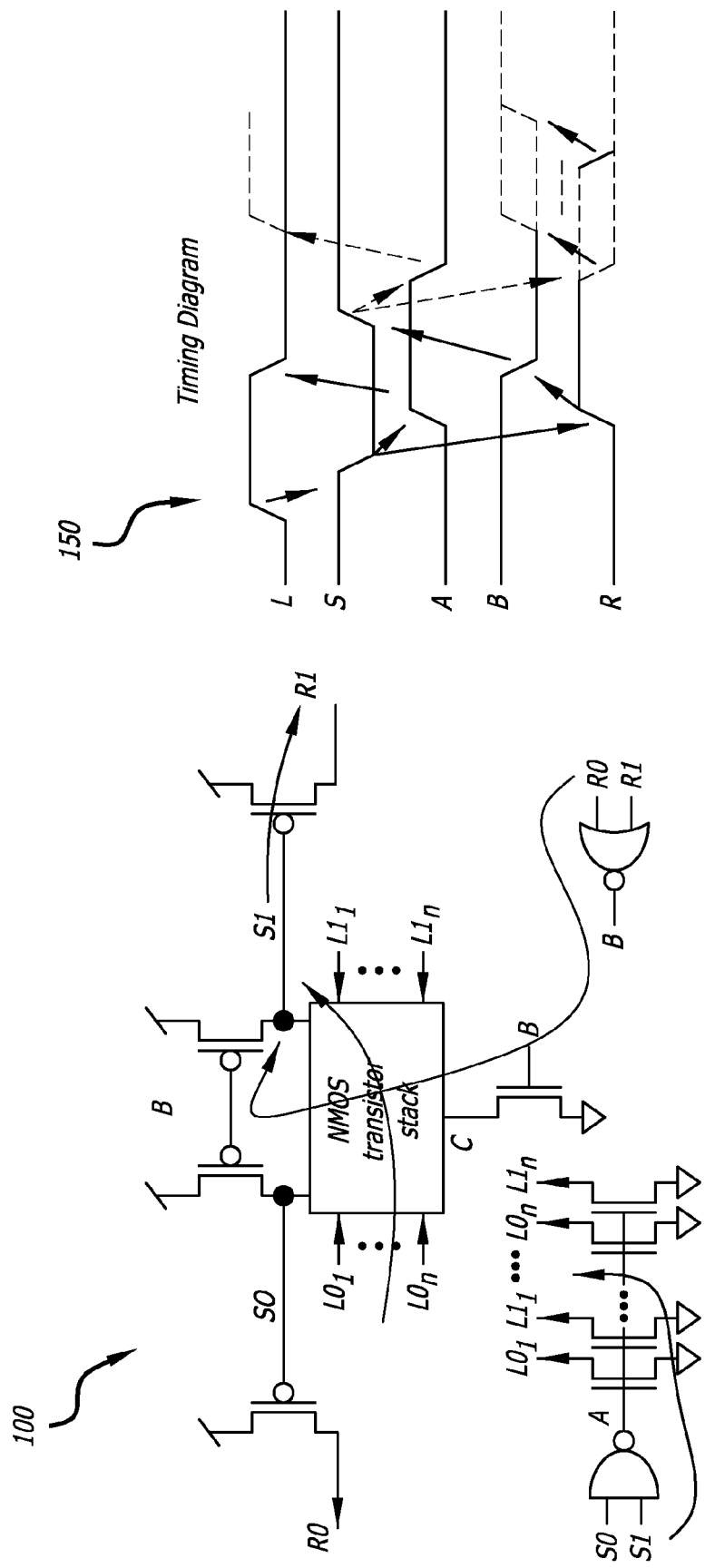
FIG. 1 depicts a circuit diagram of a static single track full buffer and a related timing diagram, in accordance with exemplary embodiments of the present disclosure.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Aspects of the present disclosure are, in general terms, directed to methods and systems providing for effective timing and power characterization flows for asynchronous circuits. For such, static timing analysis ("STA") can be utilized, so as to provide fast and an accurate timing and performance verification without simulation, can be utilized. Fully-automated flows are provided by embodiments of the present disclosure for timing and performance verification. For such, a commercial tool, e.g., the Synopsys® PrimeTime® tool, or the like, can be utilized. Flow is successfully demonstrated on two different asynchronous design templates according to exemplary embodiments.

As will be described in further detail in the following text, exemplary embodiments are directed to different asynchronous design methodologies, a including static single track full buffer ("SSTFB"), a pre-charged-half-buffer ("PCHB") template, and/or a multi-level domino ("MLD") template in which stages consist of multi-level domino-dual-rail logic and a full-buffer handshake controller.

A pre-cursor to STA is library characterization. Asynchronous logic cells not found in standard-cell libraries, such as dual-rail domino logic and dynamic C-elements with staticizers, can be characterized in terms of both their timing and power. In particular these values are a function of both input slew (input transition time; as opposed to output slew or transition time) and output load and are preferably captured in an industry standard format, such as the Liberty™ file format, before being compatible with commercial STA tools. Fortunately, even complex asynchronous cells such as the high speed single-track circuits have been successfully characterized. Using a characterized library, timing correctness and performance of an asynchronous circuit can be analyzed either through back-annotated simulations or preferably static analysis as described herein.

The static timing analysis flow for any template based design can include three steps. The first step is to capture the timing constraints (relative and minimum pulse width) within a suitable timing application, e.g., the PrimeTime® tool made commercially available by Synopsys®, Inc. The second step is to break combinational loops which should be done in a manner that doesn't break paths of interest. The last step is to do performance verification. All these steps are described in detail in the following sections.

Embodiments of the present disclosure can provide for verification of both relative-timing constraints as well as performance (e.g., throughput) targets using commercially-standard STA tools. Fully-automated scripts are developed for exemplary embodiments that verify all relative timing assumptions (e.g., isochronic forks) as well as the gate-level performance of any circuit designed with these templates. For hierarchical designs, which can offer flexibility for different applications, asynchronous cells or "standard blocks" can be put together in a hierarchical manner to create meaningful circuits that match a given specification.

Delay and Power Characterization

Both delay and power consumption of a library can be characterized and stored in an industry format (e.g., Liberty™) file. For delay, both pin to pin delays and the corresponding output slopes are typically characterized for identified timing arcs as a function of load and/or input slope. In general, this allows slews to propagate during delay and timing analysis and be used to characterize and analyze power consumption.

For power, both static and dynamic sources of power are characterized. Dynamic power is made up of internal power and switching power. The former is dissipated by the cell in the absence of a load capacitance and the latter is the component that is dissipated while charging/discharging a load capacitance. Dynamic power is measured per timing arc (as with delay). Static dissipation is due to leakage currents through 'OFF' transistors and can be significant when the circuit is in the idle state (when there is no switching activity). It has four principle sources: reverse-biased junction leakage current, gate induced drain leakage, gate direct-tunneling leakage and subthreshold (weak inversion) leakage. For example, for 180 nm features, gate leakage is about 0.1% of total static power and subthreshold leakage dominates. The other two components are much smaller and thus generally ignored. With the above simplification, leakage power can be computed as the product of supply voltage and the sub-threshold leakage current. Unlike delay and dynamic power, leakage power is typically represented as a single value per cell. The delay and power consumption of a library characterization can be used for modeling asynchronous circuits, including those of exemplary embodiments described below.

A. Single Track Full Buffer Cells

Exemplary embodiments of the present disclosure are directed to static single track full buffer ("STFB") cells. The cell behavior of a SSTFB is decomposed into a set of timing arcs that can be understood by commercial place and route and back annotation tools. A novel methodology and tool kit are described that can automatically characterize the library and represent the information in the commercially supported Liberty™ file format. Relative-timing constraints as well as performance (e.g., throughput) targets can be verified using standard STA tools for different asynchronous design methodologies, including the pre-charged-half-buffer template, a template in which stages consist of multi-level domino-dual-rail logic and a full-buffer handshake controller, and a non template-based hierarchical design methodology.

A static single track full buffer ("SSTFB") is an asynchronous design template that uses dual rail domino circuit configuration that is pre-charged by an asynchronous control signal instead of a clock. It uses a 2-phase handshaking protocol where the sender pulls the channel high and the receiver pulls the channel low. FIG. 1 shows the general structure of a SSTFB template 100 and related timing diagram 150, in accordance with an exemplary embodiment of the present disclosure. The local cycle time of the SSTFB template is 6 transitions with a forward latency of 2 transitions. It is called a full-buffer because each buffer stage can hold one token. The template is very flexible and can be expanded to implement different functionalities by enabling multiple 1oiN input channels, arbitrary NMOS pull down logic and multiple 1ofN output channels.

As can be seen in FIG. 1, when there is no token on the right channel (R) (R is low meaning the channel is empty), the right environment enables the domino logic to process a new token. When a new token arrives at the left channel (L goes high) it is processed by lowering the state signal "S", which creates an output token on the right channel (R goes high) and asserts "A" removing the token from the left channel via reset NMOS transistors. The presence of the output token on the right channel restores the state signal and deactivates the NMOS transistor at the bottom of the N-stack thus disabling the stage from firing while the output channel is busy. The NAND gate is commonly called the state completion detector (SCD) and the NOR gate is called the right completion detector (RCD). A more detailed schematic of a SSTFB 200 is shown in FIG. 2.

With reference to FIG. 2, after the sender drives the line high, the receiver is responsible for actively keeping the line high (via the input keepers) until it wants to drive it low. Similarly, after the receiver drives the line low, the sender is responsible for actively keeping the line low until it wants to drive it high (via the output keepers). The line is always statically driven and no fight with staticizers exists. This hand-off technique enables the hold circuitry to be sized to a suitable strength creating a tradeoff between performance/power/area and robustness to noise. The inverters in the hold circuitry can be also be skewed such that they turn on early creating an overlap between the driving and hold logic. This overlap avoids the channel wire being in a tri-state condition thus making the circuit family more robust to noise. The overlap also helps ensure that the channel wires are always driven close to the power supplies further increasing noise margins.

B. Pre-Charged Half Buffer Templates

Figure 3:
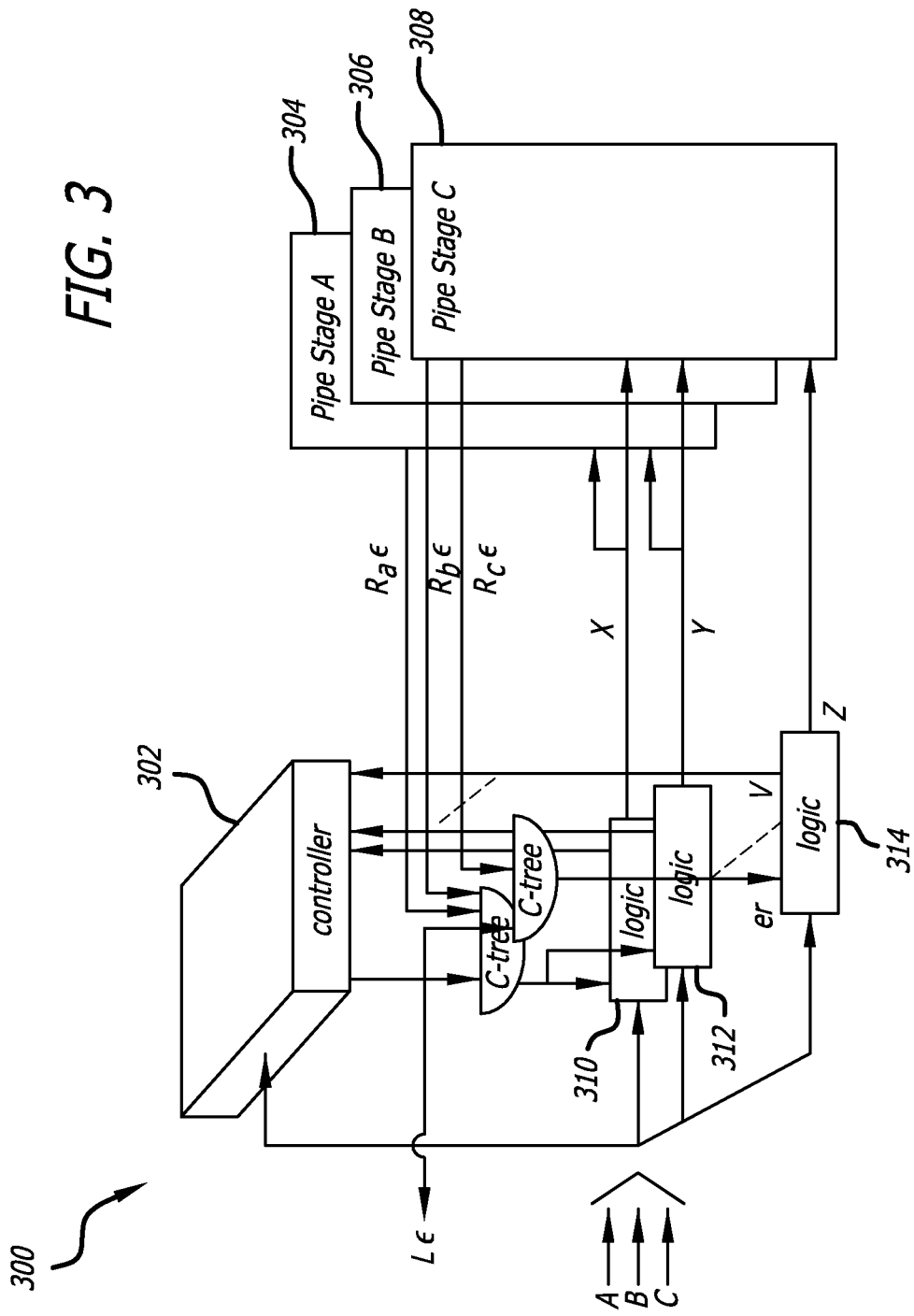
FIG. 3 depicts a block diagram of a pre-charged half buffer template, in accordance with exemplary embodiments of the present disclosure.

As mentioned previously, exemplary embodiments of the present disclosure are directed to asynchronous Pre-Charged Half Buffer circuits cells. A Pre-Charged Half Buffer (PCHB) is a quasi-delay-insensitive ("QDI") template developed at the California Institute of Technology. A single PCHB stage uses dual rail domino logic pre-charged by a single asynchronous control signal 'en' instead of two signals 'en' and 'pc'. The domino block produces a dual rail output channel R and a control signal V, which is used to detect its validity. FIG. 3 depicts a basic block diagram of a PCHB template 300, in accordance with exemplary embodiments of the present disclosure.

Template 300 can include a controller 302 and multiple pipeline stages 304, 306, and 308. In general, a pipeline stage can contain multiple logic blocks to support multiple inputs or multiple outputs. Each logic block detects the validity of its outputs and produces a signal V. The control block detects the validity of the inputs and combines it with the V signals from all the logic blocks to generate the acknowledgement Le. The acknowledgement signals from the next stages are combined using a tree of c-elements and then combined with Le out of the controller to generate en for the logic block.

The circuit 300 of FIG. 3 relies on a relative timing constraint, e.g., as indicated by the thick black lines in FIG. 4, for correct operation. FIG. 4 depicts a diagram of a three-stage PCHB pipeline 400 with three buffers 402, 404, 406, highlighting the relative timing constraint and timing loops 408, in accordance with an embodiment of the present disclosure.

With continued reference to FIG. 4, the input to the domino block should go low (neutral) before a rising transition on the control signal 'en' occurs. If this relative timing constraint is violated, the domino block may evaluate with old data creating an extra token on the output channel. Note that there are similar relative timing constraints associated with all the rails. These timing assumptions are a relaxed interpretation of the underlying isochronic fork assumption at the data inputs of this template, and, for an exemplary embodiment, have been verified to be sufficient for correctness by using the RT-Analyze tool (developed by Ken Stevens). This template 400 also has several timing loops (dotted lines 408) spanning a single to multiple stages which together dictate throughput.

C. Multi-Level Domino Template

Further embodiments of the present disclosure are directed to multi-level domino ("MLD") templates. FIG. 5 depicts a block diagram of a multi-level domino pipeline 500 highlighting the relative timing constraints (thick solid lines 502) and the minimum pulse width constraints (dotted lines 504), in accordance with exemplary embodiments of the present disclosure. A MLD templates can utilize a dual rail domino to implement the logic blocks and a separate control block like in PCHB designs. A pipeline stage can contain "n" levels of domino blocks (three are shown in FIG. 5), n−1 levels of which are pre-charged and evaluated by a single control signal 'en' while the nth level of domino is pre-charged and enabled by different control signals 'pc' and 'eval' respectively as shown in FIG. 5.

The important feature of this template is that the last level of domino per pipeline stage does not pre-charge until the next pipeline stage has consumed the token. This makes the template fast as the first n−1 domino blocks can start evaluating early with new data without having to wait for the next stage to consume the previous data. The last level of domino per stage is a special logic cell that generates a valid signal and is referred to as a v_logic cell. The pre-charge validity detector (PVD) as the name suggests is pre-charged low by the controller and only detects the validity of the stage by combining the valid signals from all the v_logic domino cells in that stage. The v_logic cells and the PVD are pre-charged simultaneously.

It is important to note here that the neutrality of the data rails is not checked explicitly. This results in a relative timing constraint on the precharge delay and minimum pulse width constraints on 'en' and 'pc'. In particular, the data inputs to the domino logic block should go neutral before the 'en' to the domino block goes high. This is to prevent the domino block from re-evaluating with old data. The minimum pulse width constraints are that the pre-charge signals 'en' and 'pc' should be low for a sufficiently long amount of time so as to pre-charge the domino blocks completely.

D. Library Characterization for a SSTFB Embodiment

In exemplary embodiments, the industry standard format for representing delay and power information of a library, i.e., the Liberty™ file format, can be used. This format supports several delay models of which the non-linear delay may be preferable as it provides a reasonable tradeoff between accuracy and complexity. This delay model uses lookup tables indexed by input slew and/or load capacitance. Four main steps can be involved in delay and power characterization. The first is defining timing arcs for the cell being characterized. The second is creating a suitable simulation environment for spice measurements. The third step is measuring power consumption and the last step is measuring pin capacitances. In addition, correct supply currents can be measured to facilitate accurate characterization of internal power. The last step (optional) is to automate the process, to a practical extent.

D1. Defining Timing Arcs

Figure 6:
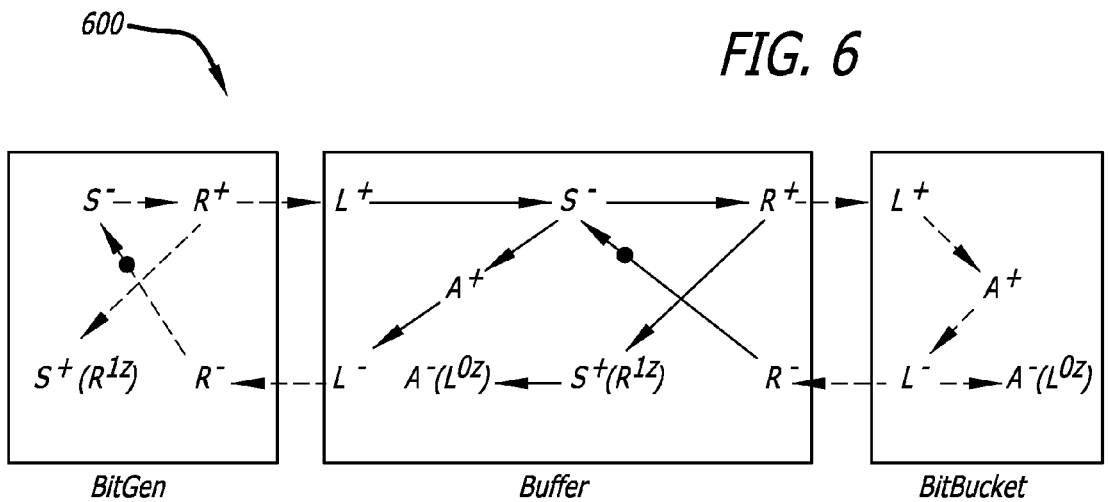
FIG. 6 depicts a marked block diagram of a SSTFB buffer surrounded by a bit generator and bit bucket, in accordance with exemplary embodiments of the present disclosure.

A set of timing arcs can be identified that capture the behavior of SSTFB. The causality between the timing arcs is formalized in a marked graph. As an example, FIG. 6 illustrates the marked graph model 600 of a buffer cell surrounded by a bit generator and bucket in which the specific data rails have been abstracted. Exemplary embodiments can include constraining the short circuit between senders and receivers. Detailed knowledge of when the driver circuits are active can be used to model the internal signals S and A as extra bi-directional pins.

With continued reference to FIG. 6, it can be noticed that the dashed edges represent the behavior of the environment whereas the solid edges refer to the behavior of the cell. The '+' symbol is used to indicate a rising transition and data going valid, '−' for a falling transition and data going neutral, '0Z' for a low to tri-state transition and '1Z' for a high to tri-state transition.

D2. Creating a Simulation Environment

Figure 7A:
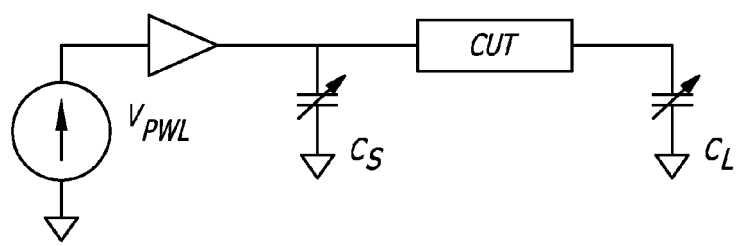
FIGS. 7A-B depict exemplary circuit diagrams for a test setup.
Figure 7B:
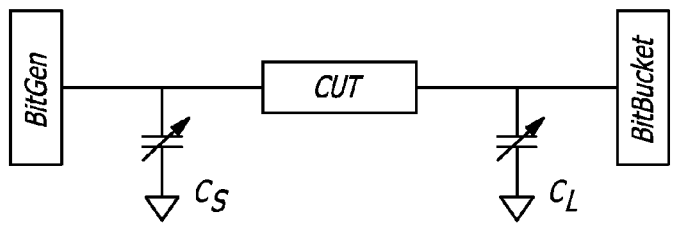

Regarding input waveforms, commercial library characterization tools can use one of two approaches to generate real-world input waveforms: the pre-driver method or a pre-driver generated 'real' non-linear waveform. FIGS. 7A-B depict exemplary circuit diagrams for a test setup. FIG. 7A depicts synchronous circuits, and FIG. 7B depicts asynchronous circuits.

A buffer is often recommended for use as the pre-driver cell 700A as shown in FIG. 7A. For asynchronous circuits, special cells are needed to generate and consume input and output tokens to/from the circuit under test ("CUT"). Commonly, these cells which form the environment 700B around the CUT are called bitgen and bucket respectively, e.g., as shown in FIG. 7B. The bitgen implicitly takes care of the input waveform generation. The input slew can be controlled by an adjustable capacitor Cs and the output load can be controlled by the capacitor CL. A ramped linear waveform is not preferred as it can by itself contribute to 5-10% delay error.

D3. Input Slew and Load Capacitance

The selection of input slew and load capacitance indices, along with creating real-world input waveforms, can directly impact the accuracy of the characterization. Delay behaves non-linearly and non-monotonically with input slew. The design usage space are preferably bounded by carefully selecting the minimum and maximum input slew and load capacitance values to minimize delay calculation error due to interpolation and extrapolation. The output load model can be simplified by assuming a lumped capacitance. The output load index must be based on the cell drive strength. The tables should have enough points for both input slew and output load index selections so as to cover non-linear or non-monotonic regions.

In the flow of an exemplary SSTFB embodiment, e.g., as indicated in FIG. 6, the minimum load capacitance was zero and the maximum was calculated such that the cell operated within pre-determined voltage swing levels. The input slew values were computed for each cell in the library based on the selected load capacitance values. The load capacitance on internal pins is fixed. Consequently timing arcs from input pins to the S and A pins need only be modeled as a 1D table (1×6) based on the input slew. However, arcs from the state pins S to the output pins R are modeled as a 2D table (6×6) based on both slew on S and output load.

D4. Measuring Power

Figure 8:
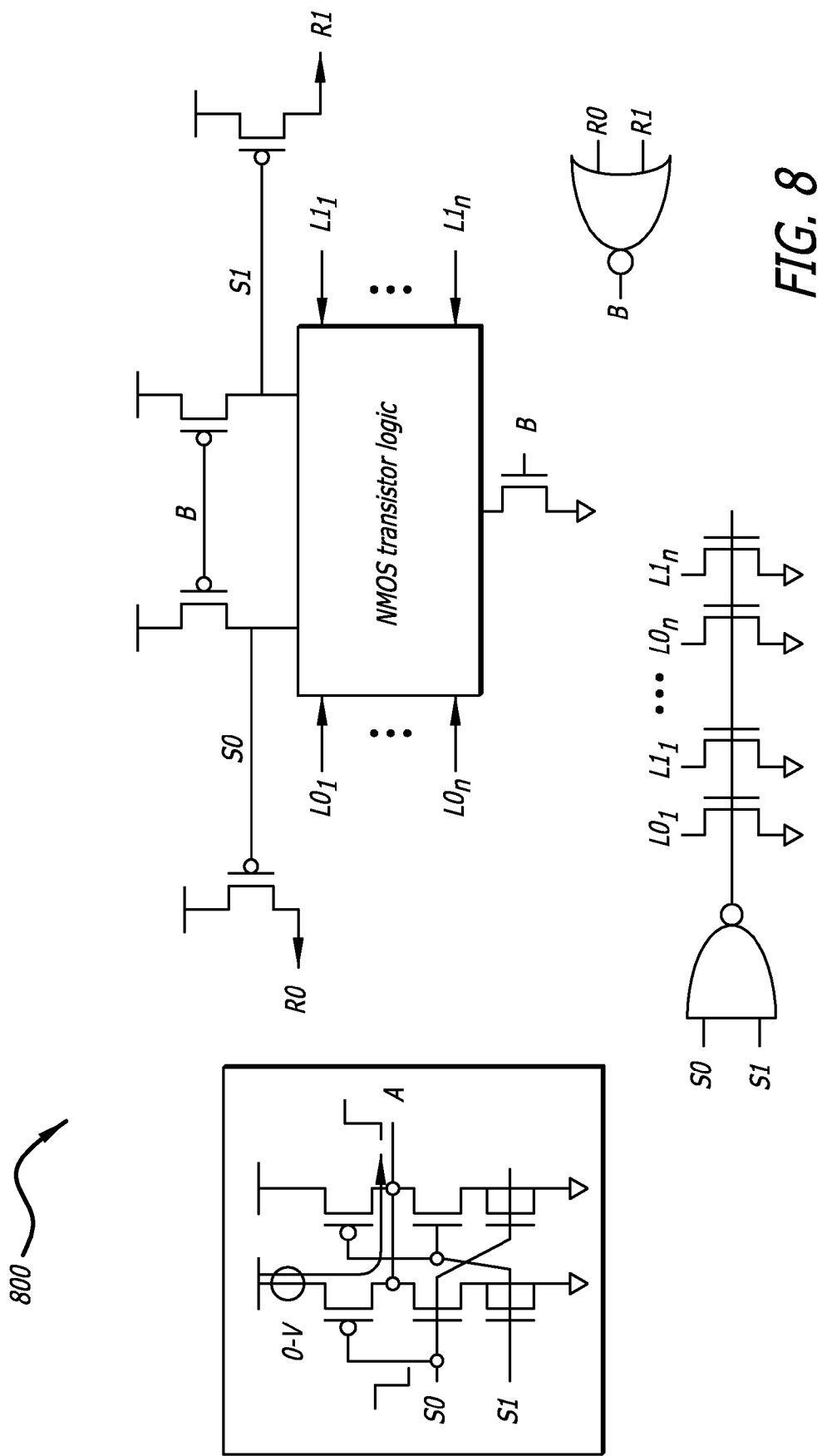
FIG. 8 depicts the addition of a 0V source to measure the internal energy associated with an identified timing arc, in accordance with an exemplary embodiment of the present disclosure.

For power characterization, the following are preformed for exemplary embodiments: partitioning the currents drawn through the supply amongst timing arcs for the dynamic component, modeling short circuit current, and modeling effects of crosstalk. The Liberty™ file format measures internal energy per timing arc which includes short-circuit power. Power analysis tools convert this internal energy to internal power by dividing by the system cycle time. They also add short-circuit energy and switching energy, the latter calculated as the energy required for switching the total net capacitance on the nets. The dynamic internal energy component of energy for an arc can be calculated using the following equation:

$$E_{arc} = \frac{\left(\left(I_{vdd \atop gnd} - I_{leakage}\right) \cdot V_{dd}\right)}{N} \cdot T, \qquad (1)$$

where, $I_{vdd/gnd}$ is the average current measured through specific voltage sources associated with the timing arc, $I_{leakage}$ is the current measured when the circuit is idle, Vdd is the supply voltage, T is total simulation trace time and N is the number of tokens processed in time T. An addition may be made of 0V voltage sources to Vdd segments of the extracted placed-and-routed netlist to measure the currents responsible for charging internal cell nodes. Further, 0V voltage sources can be added to segments of Gnd to measure the short-circuit current associated with charging output nodes (e.g., the R0/R1 nets). FIG. 8 depicts the addition of a 0V source to measure the internal energy associated with an identified timing arc, in accordance with an exemplary embodiment 800 of the present disclosure. As an example, for an SCD in a buffer, to measure the internal energy associated with the timing arc S0⁻→A⁺, a 0V source can be inserted, e.g., as shown in FIG. 8.

In general, the measured currents associated with each token value can be partitioned among the associated timing arcs that occur for each such token processed. For cells with a single-input channel, however, currents can be partitioned into one power arc for each output accessed by an arbitrarily-chosen single related pin. For cells with multiple input channels in which multiple power arcs existed for a given output, the power of all arcs can be accounted for in each arc. In this case, the power analysis tool chooses one such power arc depending on the timing of the related pins. This may lead to a small amount of error because the slew on all input channels is essentially assumed to be identical.

D5. Measuring Pin Capacitance

In an exemplary embodiment utilizing the Liberty™ file format, the pin capacitance was measure for all input/output pins, as the Liberty™ format requires pin capacitances for all input/output pins. FIG. 9A depicts a configuration 900A for measuring pin capacitance of a pin (A0) of a buffer, in accordance with an exemplary embodiment of the present disclosure. FIG. 9B depicts a configuration 900B for measuring pin capacitance of a pin (R0) of a buffer, in accordance with an exemplary embodiment of the present disclosure.

A standard delay matching technique was used to measure the pin capacitances, e.g., as shown in FIG. 9A and FIG. 9B. To measure the pin capacitance of pin A0 of the buffer, the delay $d_1$, from S0⁻ of the bitgen to A0⁺ of the buffer was measured. The buffer was then be replaced by a variable capacitor and its value swept until delay $d_2$ from S0⁻ of bitgen to R0⁺ of bitgen matched delay $d_1$. The capacitance at which the delays match gives the capacitance of pin A0.

To measure the pin capacitance of pin R0 of the buffer, the delay $d_1$, from A⁺ of the bucket to R0⁻ of the buffer was measured. The buffer was then replaced by a variable capacitor and its value swept until delay $d_2$ from A⁺ of the bucket to A0⁻ of the bucket matched delay $d_1$. The capacitance at which the delays match gives the capacitance of pin R0. For proof of concept, the delays were matched only at 50% of supply voltage but ideally the delay should be matched at several points for a more accurate capacitance value.

There are some subtleties related to the HSpice® simulator that should be taken care of while measuring the pin capacitances on channel R. In the second set-up where a load capacitor $C_L$ is attached to the left channel of the bit bucket, one of the rails of the left channel should be initialized to the logic value '1' using the .IC card in the HSpice® simulator. Also, it is preferred that the internal pin A be initialized to the logic value '0'.

Figure 10A:
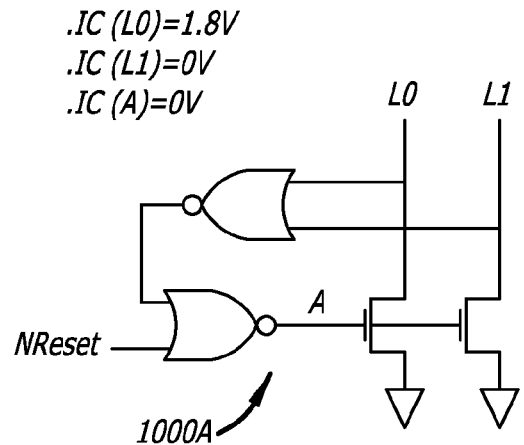
FIGS. 10A-B depict an exemplary SSTFB bitbucket schematic
Figure 10B:
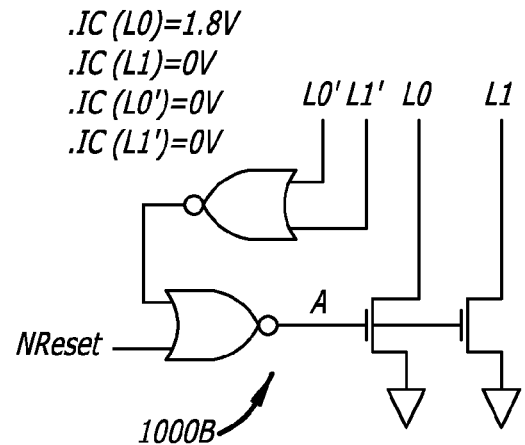

FIGS. 10A-B depict an exemplary SSTFB bitbucket schematic. FIG. 10A shows an incorrect HSpice® simulator set-up 1000A, and FIG. 10B shows a correct HSpice® simulator set-up 1000B. At time 0, the NOR gate, e.g., as shown in FIG. 10A, evaluates to a '0' causing the NAND gate to evaluate to a '1'. This causes a fight on the internal pin A creating a fake rising slew on it. Also, the state of NReset does not impact the value of pin A. If fake input channel rails L0' and L1' are created and tied low, e.g., as in FIG. 10B, the output of the NOR gate doesn't control the NAND gate anymore. Initially, NReset is held high so as to prevent the bucket from consuming the token on the false rail L0 as A is 0. Once NReset is pulled low, the NAND gate turns on causing A to rise and pull the false rail L0 low. Pin A now has a real rising slew on it.

D6. Library Generation

Figure 11:
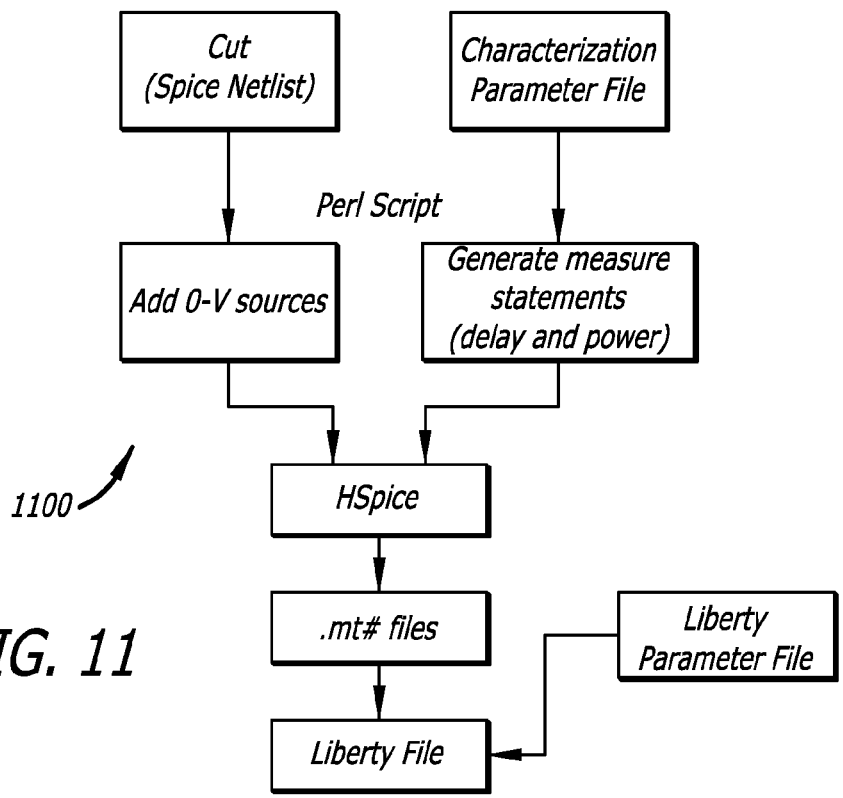
FIG. 11 depicts a block diagram of a characterization flow, in accordance with exemplary embodiments of the present disclosure.

FIG. 11 depicts a block diagram of a characterization flow 1100, in accordance with exemplary embodiments of the present disclosure. Using the previously described concepts, the flow 1100 illustrated in FIG. 11 was used for complete timing and power characterization. Spice netlists of the cells were fed to the Hspice® simulator along with Perl-generated stimulus files. These stimulus files contain measure statements for delay, slew, and energy. Data is extracted from the output of the Hspice® simulator, which is in the .mt# file format and automatically converted to the Liberty™ file format. For ease of characterization, symmetry was sometimes assumed to estimate delays and slews of one data rail using measured data from the other rail, introducing a small amount of error due to small differences in the layout between rails.

D7. Validation Results—Exemplary Embodiment

Figure 12:
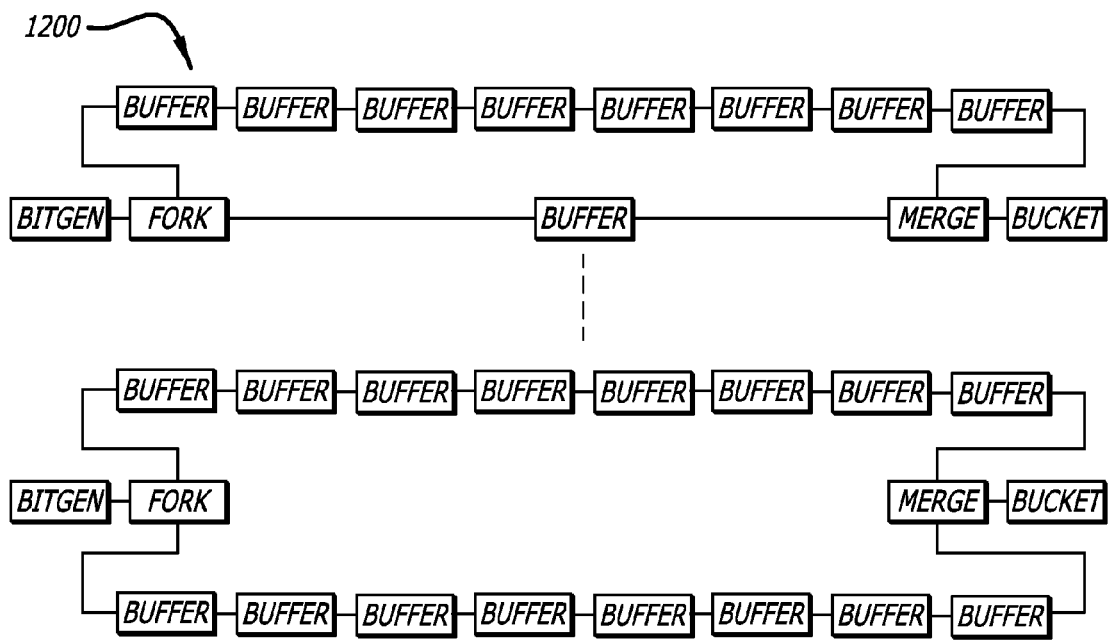
FIG. 12 depicts a block diagram of unbalanced non-linear pipelines used for validating a characterization flow, in accordance with an exemplary embodiment of the present disclosure.
Figure 13:
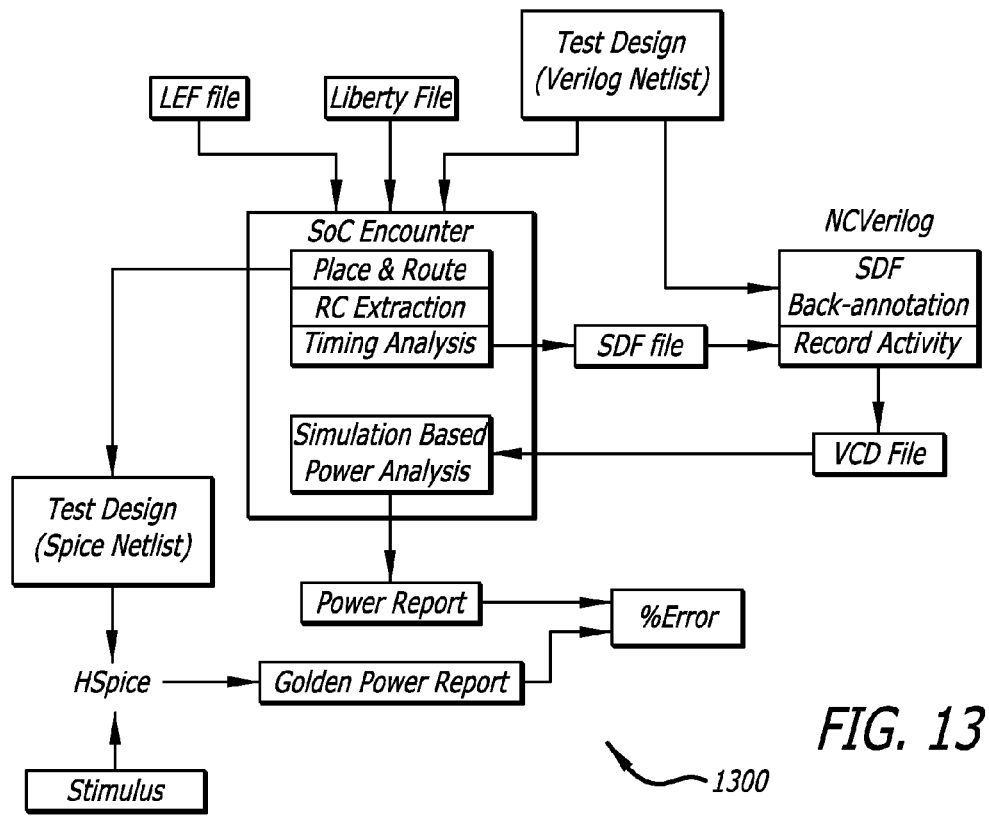
FIG. 13 depicts a block diagram of a validation flow, in accordance with an exemplary embodiment of the present disclosure.

FIG. 12 depicts a block diagram 1200 of unbalanced non-linear pipelines used for validating a characterization flow, in accordance with an exemplary embodiment of the present disclosure. To validate the quality of the characterization, several representative unbalanced non-linear pipelines were used, e.g., as shown in FIG. 12. The validation flow for an exemplary SSTFB embodiment 1300 is shown in FIG. 13. Cadence's SoC ("system on chip") Encounter® tool was used to perform delay calculation for each timing arc instance in the routed netlist using the Liberty™ file format description, recording the resulting arc delays in a standard delay format (.sdf) file. The .sdf file along with the Verilog netlist is simulated in Cadence's NC-Verilog simulator. This generated a timing-accurate value change dump (.vcd) file that records the signal activity. The .vcd file is then fed back into the SoC Encounter® tool to compute simulation-based power analysis. The results of the simulation-based timing and power analysis can be compared to simulations, e.g., the Hspice® simulator etc.

The performance and power dissipation were measured by the Hspice® simulator and the Encounter®-based flow using the prototype SSTFB library. An interesting counter-intuitive result was noticed in the performance plot, i.e., that maximum throughput was achieved when the short and long paths of the fork join structure are somewhat unbalanced, i.e., the short path has 4 buffers while the long path has 8 buffers. This fact can be attributed to the "free-slack" associated with the buffers that are faster than the FORK and JOIN cells. More balanced fork join pipelines are slightly slower due to increased wire delay and consume more energy.

The experimental results showed a maximum error between the Encounter® estimated and the Hspice® simulator numbers of 7.1%. Much of this error may be attributed to the limited slew propagation during SDF generation due to the loops and bi-directional pins in the SSTFB .lib model.

E. Performance

In many asynchronous systems, performance (e.g., throughput and latency) can be analytically determined based on a fixed gate delay model. For systems with choice this may yield an average delay dependent on specific data distributions. For systems with arbitration this may yield a distribution dependent upon the time it takes to resolve metastability or a fixed value based on a conservative estimate of resolution times. Nevertheless, an important step is to verify that the fixed-gate delay model is satisfied post-layout.

This can either be done by time-consuming back-annotated simulation or via static timing analysis. In particular, the role of STA in these cases is to verify that the fixed gate delay assumptions are satisfied. Rather than verifying that each gate satisfies its assumption, however, it suffices to assume that every sequence of gates meets its cumulative specified delay. This allows some time-borrowing across gates while still preserving the overall performance.

Figure 14:
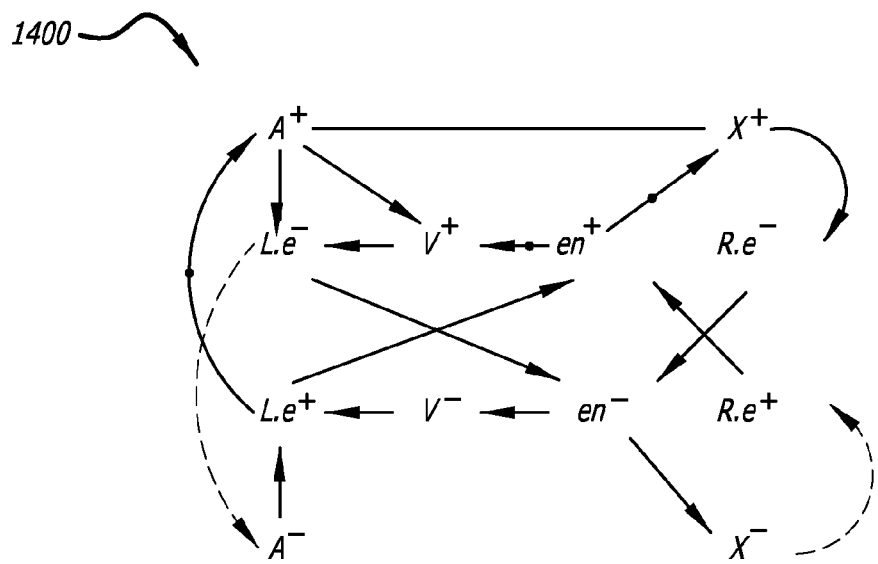
FIG. 14 depicts a cycle time schematic for a single PCHB stage, in accordance with an exemplary embodiment of the present disclosure.

As an example, the throughput and latency of a PCHB pipeline stage is captured in the collection 1400 of abstract marked graphs depicted in FIG. 14 in which each edge has a given fixed delay. Each cycle in a marked graph has a cycle metric defined as the cumulative delay around the cycle divided by the number of tokens in the cycle. The cycle time of a pipeline is determined by its maximum cycle metric. Thus using STA to verify throughput can be reduced to verifying the delay around all these cycles. The latency of the pipeline is somewhat less complex, as it is simply the longest delay from the input to output.

F. Static Timing Analysis Flow

As was described previously, the static timing analysis flow for any template based design can include three main steps. The first step is to capture the timing constraints (relative and minimum pulse width) within a suitable timing application, e.g., the PrimeTime® tool made commercially available by Synopsys®, Inc. The second step is to break combinational loops, which is preferably done in a manner that doesn't break paths of interest. The last step is to do performance verification. All these steps are described in detail in the following sections. For simplification, the various steps of the flow are explained using three-stage PCHB and MLD linear pipelines.

As described previously, exemplary embodiments of the present disclosure can utilize the PrimeTime® tool made commercially available by Synopsys®, Inc. The PrimeTime® tool is a full chip static analysis tool that can fully analyze a multimillion gate ASIC in a short amount of time. The main advantage of the PrimeTime® tool is that does not use test vectors to simulate the critical path. This vector-less approach removes the possibility that not all critical paths are identified when writing the delay vectors. Many of the commands the same as Design-Compiler. The PrimeTime® tool has the ability to analyze a design over various temperatures, voltages, and process variations and works with several file formats including Verilog, VHDL, or EDIF netlists along with numerous delay formats, standard delay format (SDF) and standard parasitic format (SPEF). The PrimeTime® tool uses the proprietary database (db) files of the standard cell and macro library to determine the delay through the cell and transition of the output pin. The last file that the PrimeTime® tool needs is the Synopsys® Design Constraints (SDC) file, which defines your ASIC to the PrimeTime® tool. The PrimeTime® tool is controlled through the tool command language ("Tcl") scripting language.

F1. Modeling Relative Timing Constraints

Figure 15:
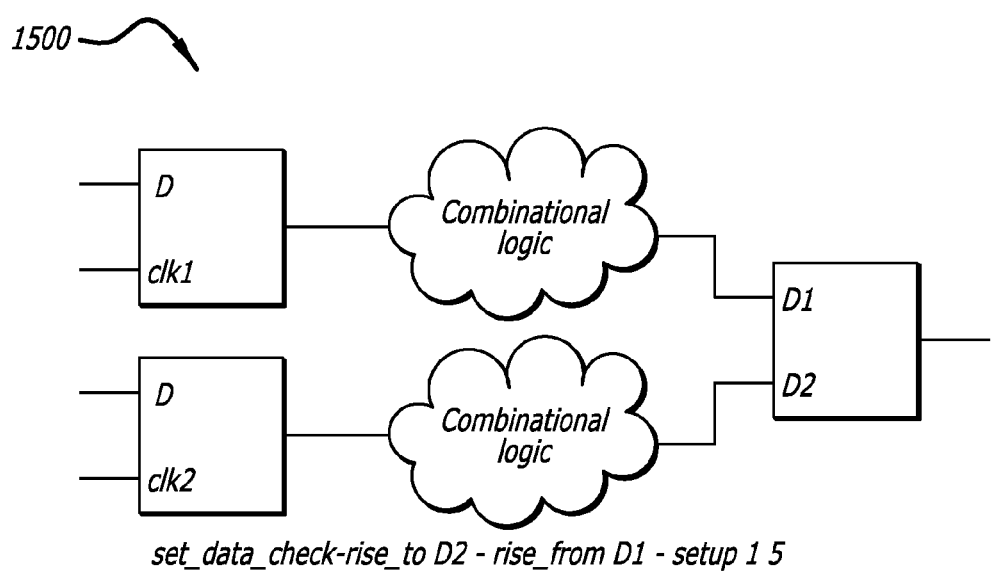
FIG. 15 depicts a diagram of a non-sequential data-to-data check, in accordance with an exemplary embodiment of the present disclosure.

A hold or a setup check between two data signals is called a non-sequential constraint, and the Synopsys® PrimeTime® tool allows the designer to check such a constraint using a command called set_data_check. FIG. 15 depicts a diagram 1500 of a non-sequential data-to-data check, in accordance with an exemplary embodiment of the present disclosure. In the synchronous world, one of these data signals D1 might be used to capture data on the other data signal D2 as shown by the diagram 1500 depicted in FIG. 15. The command shown will check if the rising transition on D1 occurs a setup time 1.5 ns before the rising edge on D2. The command constrains pin D1 relative to pin D2 and thus the names constrained pin and related pin. This command compares the slowest path to the constrained pin to the fastest path to the related pin to verify that the specified setup time was met. This is synonymous to checking if the latest arriving data signal sets up a setup time before the earliest edge of the clock. For a more accurate post-layout analysis, the PrimeTime® tool's on-chip variation (OCV) mode can be used to account for PVT variations between the two paths of interest.

The relative timing constraints stemming from a fork can be easily modeled using the set_data_check command and modeling the ends of the fork as constrained and related pins. The start of the fork is commonly referred to as the point of divergence ("POD"). In the case of PCHB and MLD, the data rails are the constrained pins and the enable pins 'en' are the related pins. The path from the POD to the constrained pin is referred to as the short path and the path from the POD to the related pin is referred to as the long path. For a three stage PCHB pipeline and a three stage MLD pipeline the commands are listed in Table 1, below. There are six RT constraints for the three-stage PCHB pipeline and four RT constraints for the three-stage MLD pipeline. For the purpose of illustration, an arbitrary setup margin of 0.5 ns was chosen for the data checks.

TABLE 1

Modeling the relative timing constraints using set_data_check for (a) PCHB, and (b) MLD templates set_data_check -rise_from buf1/en -fall_to buf1/A[0].0 -setup 0 5
set_data_check -rise_from buf1/en -fall_to buf1/A[0].1 -setup 0 5
set_data_check -rise_from buf2/en -fall_to buf2/A[0].0 -setup 0 5
set_data_check -rise_from buf2/en -fall_to buf2/A[0].1 -setup 0 5
set_data_check -rise_from buf3/en -fall_to buf3/A[0].0 -setup 0 5
set_data_check -rise_from buf3/en -fall_to buf3/A[0].1 -setup 0 5
(a)
set_data_check -rise_from buf2/eval -fall_to buf2/A[0].0 -setup 0 5
set_data_check -rise_from buf2/eval -fall_to buf2/A[0].1 -setup 0 5
(b)

For some applications, there can be several challenges involved in modeling RT constraints in the PrimeTime® tool. In the case of circuits of the described embodiments, a challenge is the absence of clocks due to which the PrimeTime® tool does not have a reference point to start off with. Creating multiple clocks in the design poses a second challenge. With multiple clocks in the design, the related or the constrained pins can come from different clock domains in which case the PrimeTime® tool will check the paths separately and put them in different clock domains. In the case of the forks, both the short and the long paths start at the same point, i.e., the POD.

These road blocks can be removed by creating a clock on every POD and specifying them explicitly using the -clock option in the data check command. Creating a clock in this manner creates a cut point at the POD and care must be taken to make sure that any paths of interest are not destroyed. Specifying the clock explicitly has the added benefit of reducing the number of paths the PrimeTime® tool needs to analyze potentially reducing the run time. The downside of, this is that the slew information on the POD is lost as the tool creates an ideal clock which can lead to over optimistic results. This effect can be mitigated by moving the POD back one level for every stage except the first.

The launching clock may be an optional argument to the set_data_check command to ensure the correct enumeration of paths.

The POD and the POC may be modeled as the launch and capture points respectively by creating virtual clocks on the PODs. Creating multiple clocks in the design may pose other challenges. First, the related or the constrained pins may now originate from different clock domains in which case PrimeTime may check the paths separately and report all the combinations. In the case of the forks, both the short and the long paths may start at the same point: the POD. Second, creating virtual clocks on pins in the design may create cut points in the corresponding timing graph. Thus any virtual clock that intersects a constraint may cause a timing path in that constraint to be broken and thus may make it impossible to verify the two constraints in the same PrimeTime run.

A solution may be to specify the launching clock explicitly using the—clock option in the data check command. This may have the added benefit of reducing the number of paths PrimeTime needs to analyze potentially reducing the run time. The downside may be that the slew information on the POD may be lost as the tool creates an ideal clock which can lead to over optimistic results. This effect can be mitigated by moving the POD back one level for every stage except the first. An important thing to note here is that now there are two paths to the related pin: one through the true rail and one through the false rail. While checking for the constraint on the false rail, the path from the POD through the true rail may be disabled and vice versa to generate the correct timing reports.

Table 2, below, shows the modified commands that specify the clock domains and reflect the new PODs in the case of a PCHB embodiment. An important thing to note here is that now there are two paths to the related pin: one through the true rail and one through the false rail. While checking for the constraint on the false rail, the path from the POD through the true rail should be disabled and vice versa to generate the correct timing reports.

TABLE 2

Modified set_data_check commands
for (a) PCHB and (b) MLD templates set_data check -clock buf1/A[0] -rise_from buf2/en
　　　　　　　　　　　　-fall_to buf2/A[C].C -setup C.5
set_data check -clock buf1/en -rise_from buf2/en
　　　　　　　　　　　　-fall_to buf2/A[C].C -setup C.5
set_data check -clock buf2/en -rise_from buf3/en
　　　　　　　　　　　　-fall_to buf3/A[C].C -setup C.5
(a)
set_data check -clock buf1/pc -rise_from buf2/eval
　　　　　　　　　　　　-fall_to buf2/A[C].C -setup C.5
(b)

F2. Modeling the Minimum Pulse Width Constraints

Figure 16:
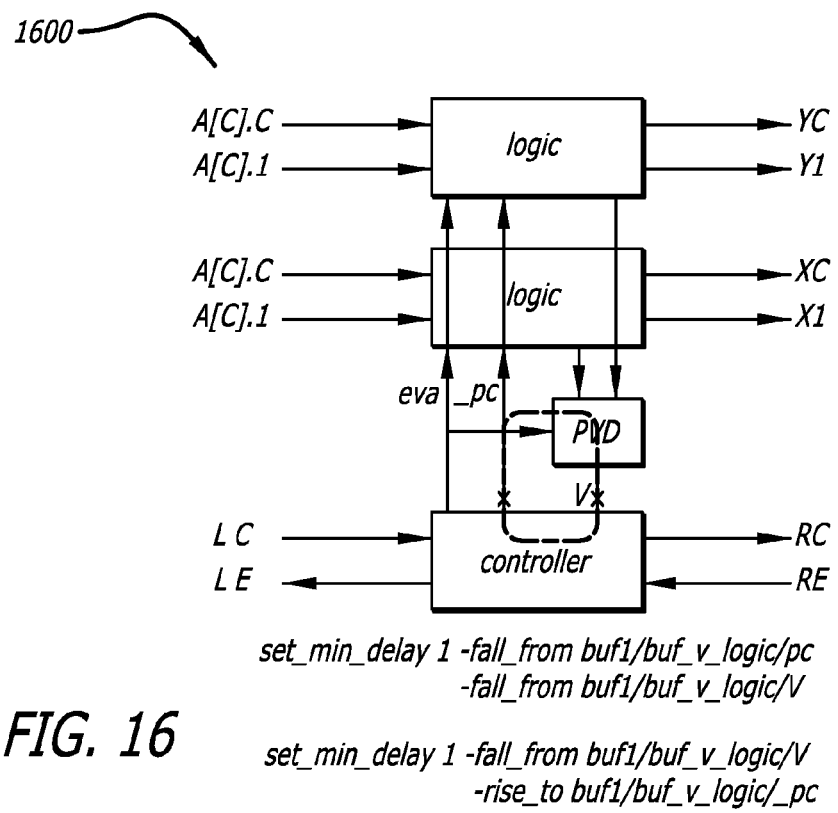
FIG. 16 is a diagram depicting the modeling of minimum pulse width constraint, in accordance with an exemplary embodiment of the present disclosure.

The minimum pulse width constraint in a MLD cell spans a timing loop as shown in FIG. 5. This means that the constraint needs to be decomposed into at least two segments depending on how the loop is broken. The natural approach to modeling this in the PrimeTime® tool is by constraining it as a minimum delay constraint using the command set_min_delay. FIG. 16 is a diagram 1600 depicting the modeling of minimum pulse width constraint, in accordance with an exemplary embodiment of the present disclosure. An example command set is shown in FIG. 16 where the loop is broken at the boundaries of the control block yielding two minimum delay constraints.

F3. Breaking Timing Loops

The PrimeTime® tool has two loop breaking techniques: static loop breaking and dynamic loop breaking. With static loop breaking, the tool automatically breaks loops by disabling timing arcs during the initial timing analysis. These loop breaks persist throughout the the PrimeTime® tool run until another run is initiated. Dynamic loop breaking on the other hand does not permanently disable any timing arcs and guarantees that all paths will be reported. Both these techniques don't work for asynchronous circuits due to several reasons.

Figure 17:
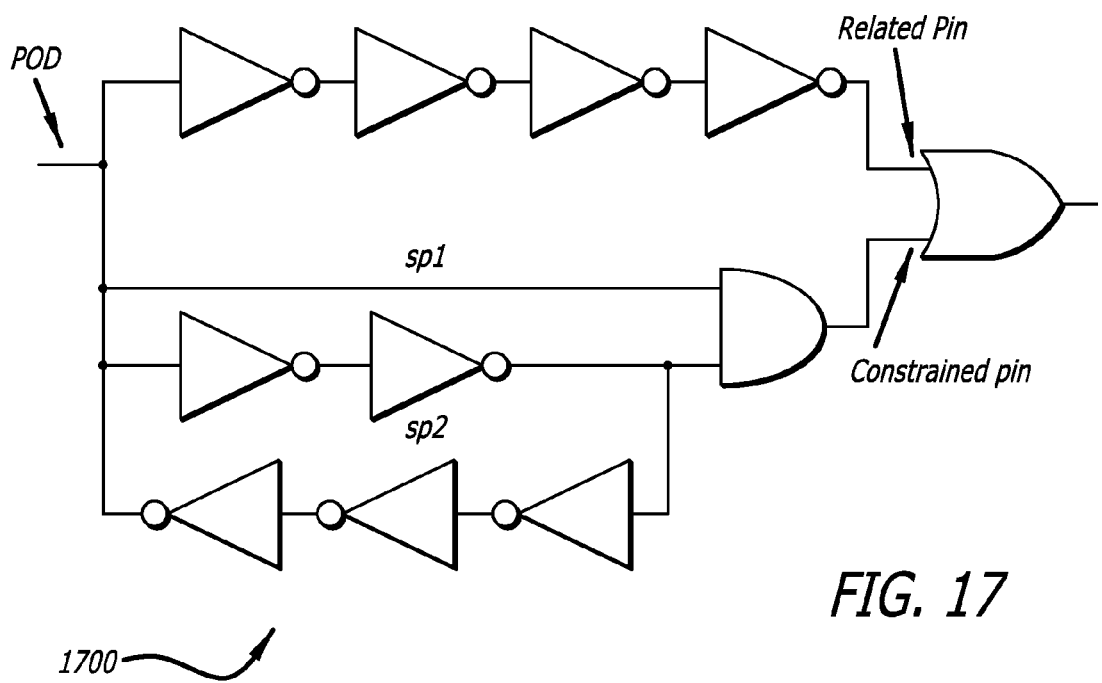
FIG. 17 is a diagram of static loop breaking, in accordance with an exemplary embodiment of the present disclosure.

Static loop breaking has the potential for disabling paths of interest resulting in incorrect timing reports. FIG. 17 is a diagram 1700 of static loop breaking, in accordance with an exemplary embodiment of the present disclosure. Consider the example in FIG. 17 where there are two paths to the constrained pin, labeled sp1 and sp2. There is also a combinational loop that includes path sp2 which is the slowest short path. If the PrimeTime® tool disables a timing path through any of the inverters in path sp2, then path sp1 will become the new slowest short path resulting in an incorrect data check report. If there was only one short path sp2, then the PrimeTime® tool would not find any paths for the data check report.

Figure 18A:
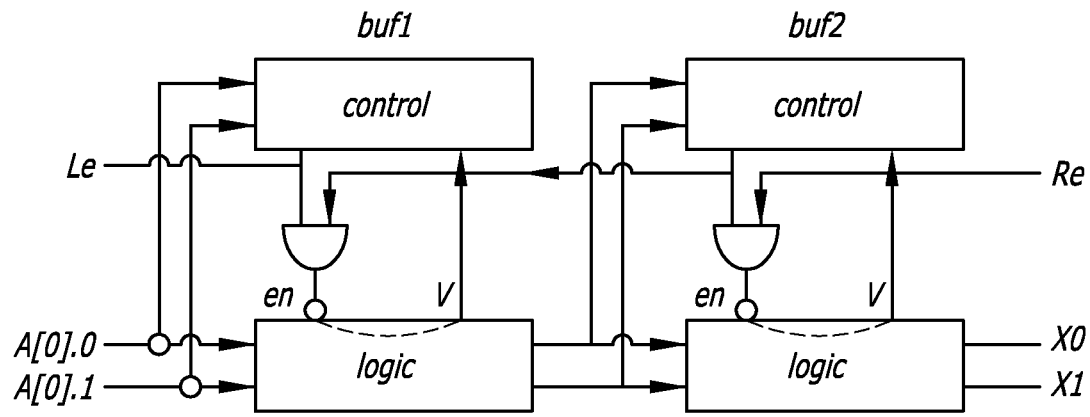
FIGS. 18A-B depict exemplary diagrams of clocks and loop breaks.
Figure 18B:
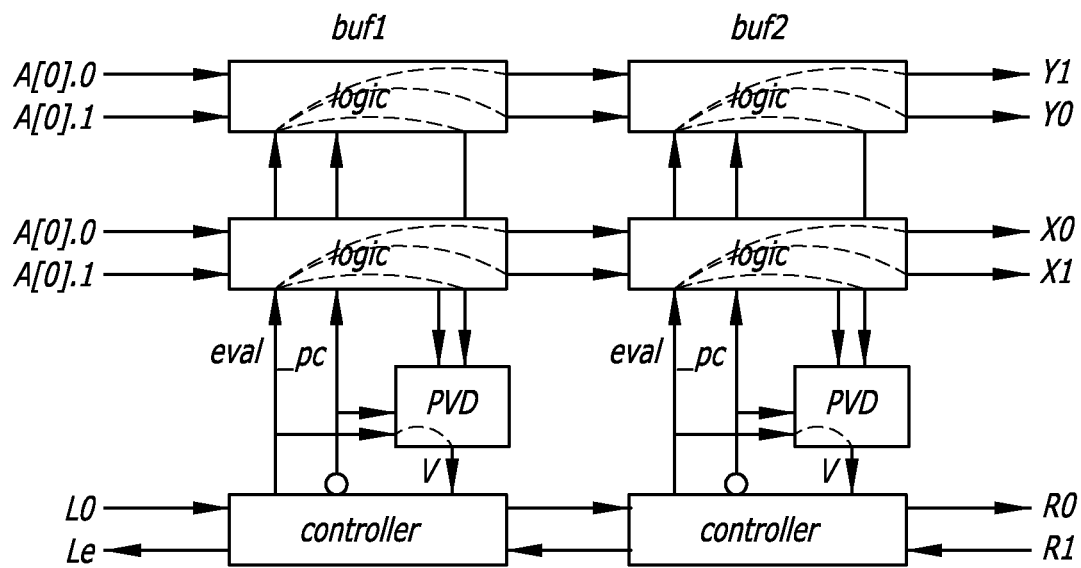

The problem with dynamic loop breaking is that the loop breaking flexibility is accompanied by heavy memory usage and large run-time making it impractical for even a medium sized design. Due to these reasons, loops can be explicitly broken by disabling timing paths carefully so as not to break any paths of interest. This is done with the command set_disable_timing. FIGS. 18A-B depict exemplary diagrams of clocks and loop breaks. FIG. 18A depicts PCHB 1800A and FIG. 18B depicts MLD 1800B templates. FIGS. 18A-B show where the loops (dotted lines) are broken for both PCHB and MLD. The dots indicate the location of the clocks.

FIG. 19 depicts a relative timing constraints verification script 1900 for a PCHB template, in accordance with exemplary embodiments of the present disclosure. Portions of the fully automated RT constraints verification scripts for PCHB are shown in FIG. 19. Internal PrimeTime® tool commands can be used to get all cells of type LOGIC, get connectivity information to determine the POD, the related and the constrained pins to create the constraints and apply them automatically. Some cells such as token buffers need special handling and are not shown in the figure for simplicity. The other relative timing and performance scripts were also written in a similar manner.

With continued reference to FIG. 19, it may be noted that the first for loop that divides the verification of the constraints into two sets. One set for the false rails and the other for the true rails. This is because the long path traverses the data rails and the timing arcs from the POD to one of the rails is disabled. In the case of an MLD, however, all the constraints can be verified in a single set as the long path does not go through the data rails. This also enables generation the timing reports associated with both the rails at once at the end of the script. A potential problem may occur where it is impossible to break loops without breaking paths of interest or overlapping relative timing constraints exist in which the POD of one constraint intersects the long or the short path of another constraint. The solution in these cases is to partition the constraints and verify each non-conflicting set of constraints in a separate PrimeTime® tool run.

As was described previously, fully-automated scripts can be provided by exemplary embodiments of the present disclosure. Examples of fully-automated scripts are included in the computer program listing appendix submitted on the compact disc ("CD") submitted for the present disclosure and containing the following named files: "A.1. Relative timing constraints verification script for PCHB" created on 1 Mar. 2007 and 9.363 KB in size; "A.2. Performance verification script for PCHB" created on 15 Mar. 2007 and 12.720 KB in size; "A.3. Relative timing constraints verification script for MLD" created on 1 Apr. 2007 and 5.891 KB in size; and "A.4. Performance verification script for MLD" created on 15 Apr. 2007 and 12.037 KB in size; the contents of all of which are incorporated herein by reference.

F4. Modeling Performance

As described previously, the cycle time of these pipelines is reduced to verifying the timing of the loops. Because of the limitations of STA tools, these timing loops can be decomposed into two or more segments, or paths, by creating cut points. The delay of these segments can then be verified using maximum delay constraints with the command set_max_delay. The approach then is as follows: identify a minimal set of cut-points that break all timing loops; constrain all segments with a maximum delay constraint where the maximum delay value is the sum of the specified delays of all timing arcs in the segment; and, if all segments meet timing, then all cycle time constraints are met.

Notice that the latency of a design is simultaneously verified as long as segments that begin at primary inputs and/or end at primary outputs are identified, constrained, and verified. It can be noted that this decomposition does force some conservativeness as time borrowing across segments is disallowed. In the case of the PCHB pipeline, creating cut-points at all the enable pins of the logic blocks cuts all the timing loops.

G. Results

An embodiment of a PCHB proposed flow was fully automated using Tcl (tool command language) and run on several ISCAS benchmarks that were synthesized to a synchronous image netlist and then automatically translated to PCHB and MLD pipelines. The run times for constraint verification and performance verification on a Sun Blade 1000 machine with 2GB RAM are shown in Table 3 and Table 4 below. FIGS. 20A-B depict exemplary relative timing constraints verification reports 2000A, 2000B. FIG. 20A depicts PCHB and FIG. 20B depicts MLD templates. FIGS. 21A-B depict exemplary performance verification reports 2100A, 2100B. FIG. 21a depicts PCHB and FIG. 21B depicts MLD templates.

For the purpose of illustration, an arbitrary setup margin of 0.5 ns was used for constraint verification and an arbitrary maximum delay value of 2 ns was used to constrain the segments for performance verification. In this example, the RT constrain is satisfied with a left-over margin of 0.2 ns for PCHB and 0.42 ns for MLD. The first half of the constraint verification report shows the short path and the second half of the report shows the long path for the data check. In the case of performance verification, the segment shown satisfies the maximum delay constraint with a left-over margin of 0.39 ns for PCHB and 1.93 ns for MLD.

TABLE 3

Run times for RT constraints verification

| ISCAS benchmark | PCHB | | MLD | |
|---|---|---|---|---|
| | No. of Constraints | Run Time (sec) | No. of Constraints | Run Time (sec) |
| s298 | 230 | 8 | 212 | 5 |
| s400 | 374 | 14 | 296 | 8 |
| s1423 | 1616 | 115 | 1456 | 63 |
| c3540 | 6870 | 17 min | 7560 | 11 min |

TABLE 4

Run times for performance verification

| ISCAS benchmark | PCHB | | MLD | |
|---|---|---|---|---|
| | No. of Constraints | Run Time (sec) | No. of Constraints | Run Time (sec) |
| s298 | 963 | 6 | 4613 | 18 |
| s400 | 1447 | 12 | 6268 | 18 |
| s1423 | 4574 | 41 | 112727 | 5 min |
| c3540 | 23414 | 210 | 747426 | 1 hr 19 min |

Figure 22:
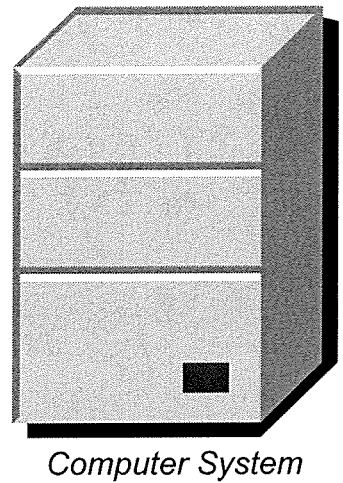
FIG. 22 illustrates an example of a computer system that may be used to implement the functions of the computer system that has been described herein.

FIG. 22 illustrates an example of a computer system that may be used to implement the functions of the computer system that has been described herein.

Figure 23:
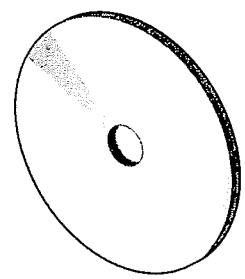
FIG. 23 illustrates an example of computer-readable media that may contain a computer-executable program configured to implement the functions described herein.

FIG. 23 illustrates an example of computer-readable media that may contain a computer-executable program configured to implement the functions described herein.

Figures 24, 25:
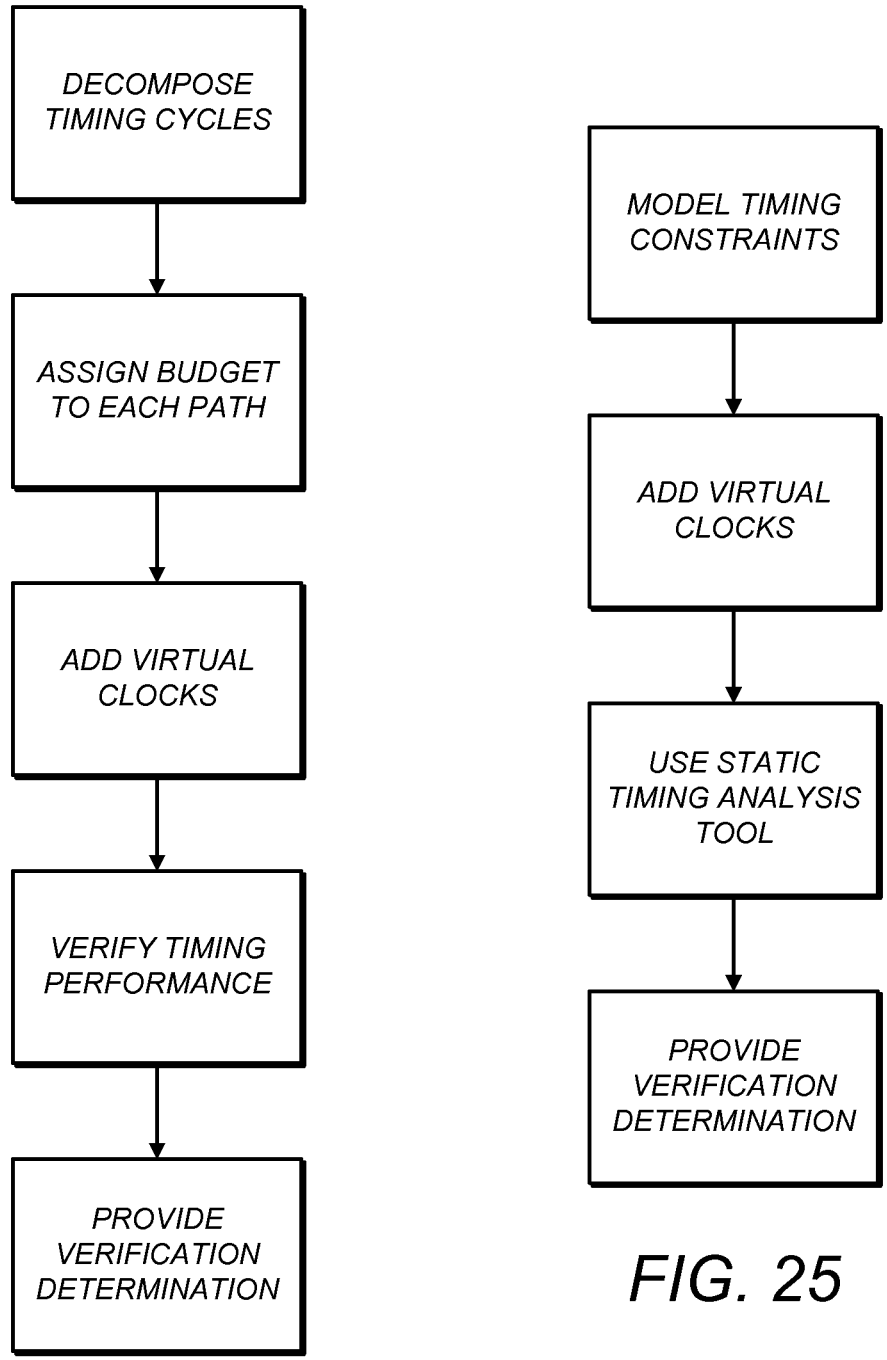
FIG. 24 illustrates a method of modeling performance of asynchronous circuits.
FIG. 25 illustrates a method for modeling relative timing constraints of asynchronous circuits.

FIG. 24 illustrates a method of modeling performance of asynchronous circuits. Examples and descriptions of approaches for each step are discussed above.

FIG. 25 illustrates a method for modeling relative timing constraints of asynchronous circuits. Examples and descriptions of approaches for each step are discussed above.

Figure 26:
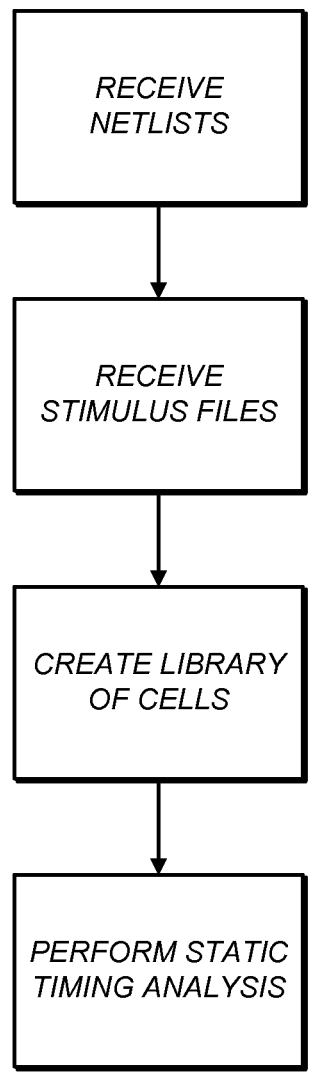
FIG. 26 illustrates a method for characterizing timing and power characteristics of an asynchronous cell.

FIG. 26 illustrates a method for characterizing timing and power characteristics of an asynchronous cell. Examples and descriptions of approaches for each step are discussed above.

Conclusion

Accordingly, aspects and embodiments of the present disclosure provide for effective timing and power characterization flows for asynchronous circuits. Embodiments of the present disclosure can provide for verification of both relative-timing constraints as well as performance (e.g., throughput) targets using commercially-available STA tools. Fully-automated scripts can be developed that verify all relative timing assumptions (e.g., isochronic forks) as well as the gate-level performance of any circuit designed with these templates.

Additionally, the present disclosure demonstrates a fully-automated flow for pre and post layout static timing analysis ("STA") for two template-based asynchronous circuits using a commercial STA tool. It is not specific to a design and can be used to verify the timing of any design, e.g., those built using PCHB or MLD templates, or SSTFB templates. Performance verification flows for exemplary embodiments verifies a fixed delay model that allows time borrowing across gates in a segment but not across segments.

While certain embodiments have been described herein, it will be understood by one skilled in the art that the methods, systems, and apparatus of the present disclosure may be embodied in other specific forms without departing from the spirit thereof. For example, while exemplary embodiments have been described in the context of Prime Time as a static analysis tool, use of the Liberty file format, and user of the Perl languages, other STA tools, file formats, and computer programming languages can be used within the scope of the present disclosure. Accordingly, the embodiments described herein, and as claimed in the attached claims, are to be considered in all respects as illustrative of the present disclosure and not restrictive.

What is claimed is:

1. Non-transitory, tangible, computer readable media containing a computer-executable program configured to implement when run in a computer system a method of modeling performance of asynchronous circuits comprising:
    decomposing timing cycles of an asynchronous circuit into paths by creating cut points,
    assigning to each path a path budget;
    adding virtual clocks to break cycles and identify the start and end of the paths to be verified;
    verifying the timing performance of the asynchronous circuit, including using a static timing analysis tool to directly verify the timing budgets for the paths; and
    providing to a user a verification determination of the timing performance of the asynchronous circuit.

2. The non-transitory, tangible, computer readable media of claim 1, wherein the method further comprises derivig each path budget by amortizing unit delays.

3. The non-transitory, tangible, computer readable media of claim 1, wherein the method further comprises statically testing each path budget using a set_max_delay command.

4. The non-transitory, tangible, computer readable media of claim 1, wherein the method further comprises application to a multi-level domino (MLD) template.

5. The non-transitory, tangible, computer readable media of claim 1, wherein the method further comprises application to pre-charged-half-buffer (PCHB) template.

6. The non-transitory, tangible, computer readable media of claim 1, wherein the method further comprises using back-annotation.

7. The non-transitory, tangible, computer readable media of claim 6, wherein decomposing cycles into paths comprises the decomposition of cycles into timing arcs.

8. The non-transitory, tangible, computer readable media of claim 1, wherein the method further comprises:
capturing the constraints in an industry standard format; and
using timing-driven place-and-route commands to satisfy the constraints during physical design of the circuit.

9. The non-transitory, tangible, computer readable media of claim 6, wherein the method further comprises modeling in the Liberty file format.

10. The non-transitory, tangible, computer readable media of claim 6, wherein the method further comprises application to a Static-Single Track template.

11. The non-transitory, tangible, computer readable media of claim 6, wherein the method further comprises application to a asynchronous template including bi-directional pins.

12. Non-transitory, tangible, computer readable media containing a computer-executable program configured to implement when run in a computer system a method of modeling the relative timing constraints of asynchronous circuits comprising:
modeling timing constraints of an asynchronous circuit using one or more standard languages;
adding virtual clocks on points of divergence (POD) of timing constraints to identify the starting point of the paths in the timing constraint;
using a static timing analysis tool to directly verify the constraints; and
providing to a user a verification determination of the timing performance of the asynchronous circuit.

13. The non-transitory, tangible, computer readable media of claim 12, wherein using a static timing analysis tool comprises using a set_data_check command.

14. The non-transitory, tangible, computer readable media of claim 12, wherein the method further comprises including launching clock as an optional argument to set_data_check command to ensure the correct enumeration of paths.

15. The non-transitory, tangible, computer readable media of claim 12, wherein the method further comprises application to a multi-level domino (MLD) template.

16. The non-transitory, tangible, computer readable media of claim 12, wherein the method further comprises application to a pre-charged-half-buffer (PCHB) template.

17. The non-transitory, tangible, computer readable media of claim 12, wherein the method further comprises verifying the minimum pulse width with two corresponding set_min_path delays.

18. Non-transitory, tangible, computer readable media containing a computer-executable program configured to implement when run in a computer system a method of modeling the performance of asynchronous circuits, comprising:
decomposing cycles into paths;
assigning to each path a path budget;
adding virtual clocks to break cycles and identify the start and end of the paths to be verified; and
directly verifying the timing performance of the asynchronous circuit, including using a static timing analysis tool to directly verify the performance.

19. The non-transitory, tangible, computer readable media of claim 18, wherein the method further comprises deriving each path budget by amortizing unit delays.

20. The non-transitory, tangible, computer readable media of claim 18, wherein the method further comprises static testing each path budget using the set_max_delay command.

21. The non-transitory, tangible, computer readable media of claim 18, wherein the method further comprises instructions for application to a multi-level domino (MLD) template.

22. The non-transitory, tangible, computer readable media of claim 18, further comprising instructions for application to pre-charged-half-buffer (PCHB) template.

23. The non-transitory, tangible, computer readable media of claim 18, further comprising instructions for modeling relative timing constraints of asynchronous circuits via a set_data_check command.

24. The non-transitory, tangible, computer readable media of claim 18, further comprising instructions for using virtual clocks on points of divergence.

25. The non-transitory, tangible, computer readable media of claim 18, wherein the method further comprises including launching clock as an optional argument to set_data_check command to ensure the correct enumeration of paths.

26. The non-transitory, tangible, computer readable media of claim 18, further comprising instructions for application to a static single track full buffer (SSTFB) template.

27. A computer system for characterizing timing and power characteristics of an asynchronous design, the computer system comprising a processing system configured and arranged to:
receive one or more netlists of the asynchronous design;
receive one or more generated stimulus files;
receive an asynchronous design that includes asynchronous cells;
characterize the asynchronous cells; and
perform a performance static timing analysis of the asynchronous design by adding virtual clocks to its asynchronous cells to designate start and end points of paths for which timing characteristics are desired.

28. The computer system of claim 27, wherein the processing system is configured and arranged to output a timing report for relative timing constraints or performance verification for the asynchronous design.

29. The computer system of claim 28, further comprising a display configured and arranged to receive from the processing system and display timing or performance verification of the asynchronous design.

30. The computer system of claim 27, wherein the one or more netlists comprise Spice netlists.

31. The computer system of claim 27, wherein the one or more stimulus files comprise measure statements for delay, slew, and energy.

\* \* \* \* \*